United States Patent [19]
Takeo

[11] Patent Number: 6,114,861
[45] Date of Patent: Sep. 5, 2000

[54] APPARATUS FOR AND METHOD OF EVALUATING THE POLARIZATION CHARACTERISTIC OF A FERROELECTRIC CAPACITOR

[75] Inventor: Masato Takeo, Kyoto, Japan

[73] Assignee: Matsushita Electronics Corporation, Osaka, Japan; .

[21] Appl. No.: 09/038,332

[22] Filed: Mar. 11, 1998

[30] Foreign Application Priority Data

Mar. 14, 1997 [JP] Japan ..................................... 9-060331
Dec. 2, 1997 [JP] Japan ..................................... 9-331428

[51] Int. Cl.[7] ............................. G01R 27/26; G11C 11/22
[52] U.S. Cl. ............................ 324/658; 365/145; 365/201
[58] Field of Search ..................................... 324/658, 659, 324/676, 678, 686; 365/145, 201

[56] References Cited

U.S. PATENT DOCUMENTS 5,218,566  6/1993  Papaliolios ............................... 365/145
5,262,982  11/1993  Brassington et al. .................... 365/145
5,835,400  11/1998  Jeon et al. ............................... 365/145

FOREIGN PATENT DOCUMENTS 9-232398  9/1997  Japan .

*Primary Examiner*—Diep N. Do
*Attorney, Agent, or Firm*—Pearne, Gordon, McCoy & Granger LLP

[57] ABSTRACT

Described herein is an apparatus for evaluating the polarization characteristic of a ferroelectric capacitor. The apparatus includes a ferroelectric capacitor, a first pulse generator, a second pulse generator, a reference capacitor of a known capacitance value, and switch means. Those electronic circuit elements and components are all fabricated into a semiconductor substrate. In the apparatus, the first and second electrodes of the ferroelectric capacitor are connected to the output terminals of the first and second pulse generators. A second electrode of the ferroelectric capacitor is connected to an output terminal of the second pulse generator. The second electrode of the ferroelectric capacitor is connected to a first electrode of the reference capacitor through the switch means.

20 Claims, 26 Drawing Sheets

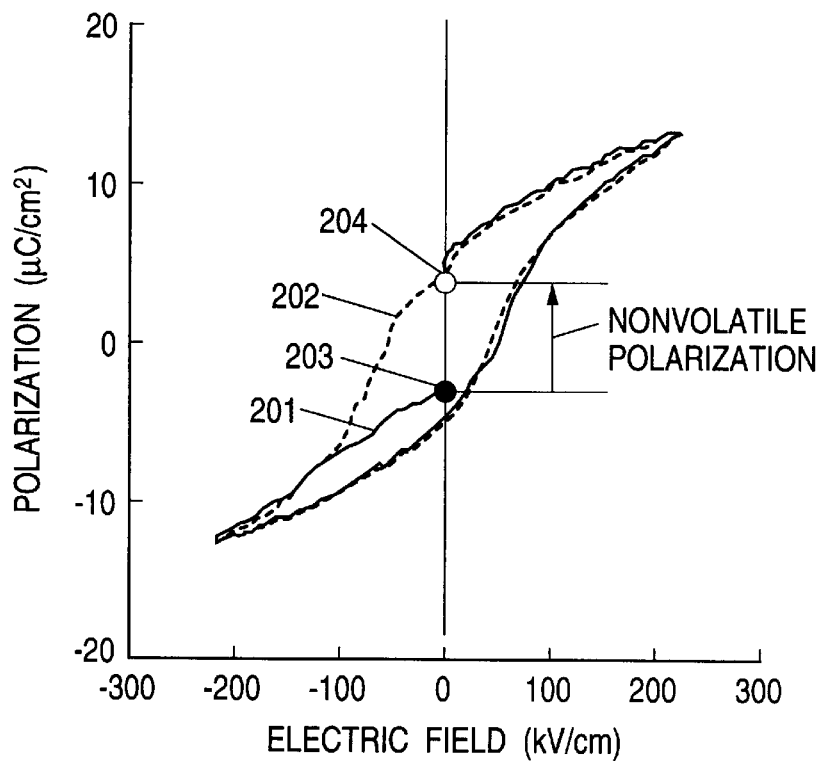
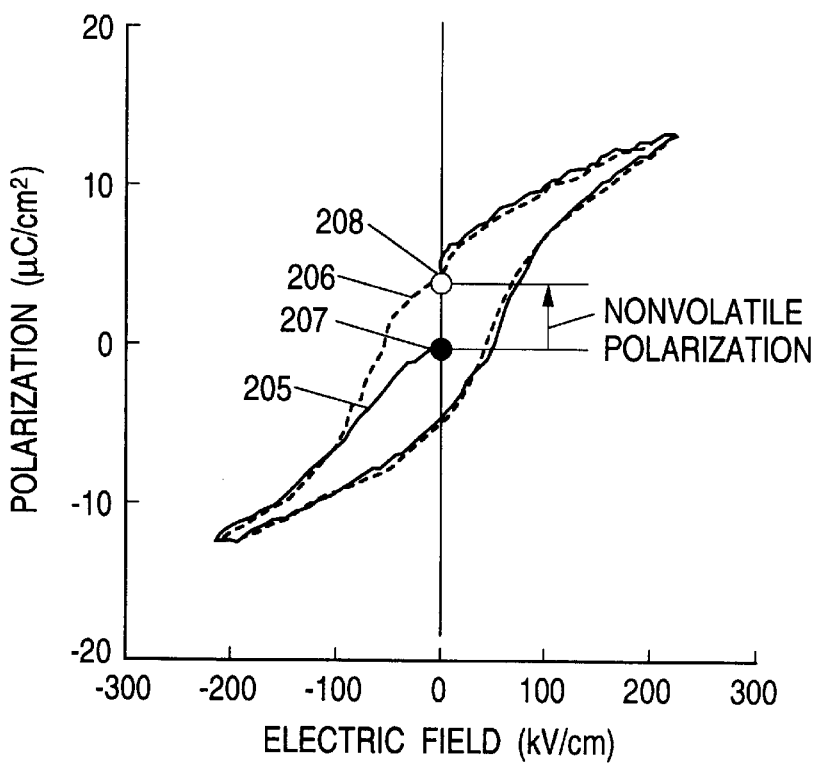

APPARATUS FOR AND METHOD OF EVALUATING THE POLARIZATION CHARACTERISTIC OF A FERROELECTRIC CAPACITOR

BACKGROUND OF THE INVENTION

1. Field of the Invention

The present invention relates to an apparatus for and a method of evaluating the polarization characteristic of a ferroelectric capacitor.

2. Description of the Related Art

Developments of nonvolatile ferroelectric memories utilizing the polarization hysteresis characteristic of a ferroelectric capacitor progress energetically. An apparatus and method for evaluating the polarization characteristic of a ferroelectric capacitor formed on a semiconductor substrate are vital to the memory developments. A SAWYER TOWER circuit is generally used in the polarization-characteristic evaluating apparatus at the present stage of this technical field.

A conventional apparatus for evaluating the polarization characteristic of a ferroelectric capacitor is shown in FIG. 29. In the FIG. 29, 1 is a semiconductor substrate; 2 is a ferroelectric capacitor; 2a is a first electrode of the ferroelectric capacitor 2; 2b is a second electrode of the same; 3 and 4 are wires; and 5 and 6 are pads. The ferroelectric capacitor 2, wires 3 and 4, and pads 5 and 6 are formed on and in the semiconductor substrate 1. Numeral 7 is a reference capacitor; 8 is a pulse generator which generates pulse signals of arbitrary waveforms; 9 is an oscilloscope; and 10 to 12 are cables. Numeral 7a is a first electrode of the reference capacitor 7; 7b is a second electrode of the same; 8a is an output terminal of the pulse generator 8; 9a is a first input terminal of the oscilloscope 9; and 9b is a second input terminal of the same. A capacitance value of the reference capacitor 7 is known.

A conventional method for evaluating the polarization characteristic of a ferroelectric capacitor is flow charted in FIG. 30.

Waveform diagrams showing voltage pulses produced by the pulse generator 8 and voltages measured and viewed by the oscilloscope 9 in evaluating the polarization characteristic of the ferroelectric capacitor by the FIG. 29 apparatus are shown in FIG. 31. In FIG. 31, (a) and (d) are the voltage pulses generated by the pulse generator 8; (b) and (e) are the voltages that are applied to the first input terminal 9a of the oscilloscope 9 and measured and observed in their waveforms by the oscilloscope; (c) and (f) are the voltages that are applied to the second input terminal 9b thereof and measured and observed in their waveforms by the oscilloscope. In the graph of FIG. 31, the vertical scale for the waveforms (c) and (f) is shorter than that for the waveforms (a) and (d), and (b) and (e). Further, numerals 51, 52 and 53 represent voltage pulses (whose waveforms are trapezoidal) generated by the pulse generator 8; 54 and 55, the voltages that are applied to the first input terminal 9a of the oscilloscope 9 and measured and viewed in their waveforms by the oscilloscope; and 56 and 57, the voltages that are applied to the second input terminal 9b thereof and measured and viewed in their waveforms by the oscilloscope. Also in FIG. 31, t1 indicates a time point where the voltage 54 starts to vary; and t2, a time point where the voltage 55 starts to vary.

A polarization characteristic of the ferroelectric capacitor, which is measured by the conventional polarization characteristic evaluating apparatus, is as shown in FIG. 32. In the figure, reference numerals 71 and 72 are polarization hysteresis curves of the ferroelectric capacitor; 73 is a polarization quantity of the capacitor at time point t1; and 74 is a polarization quantity of the same at time point t2.

How the prior polarization-characteristic evaluating apparatus evaluates the polarization characteristic of a ferroelectric capacitor will be described with reference to FIGS. 29 to 32.

[Step P1, FIG. 30]

A first trapezoidal (waveform) voltage pulse 51 that is generated by the pulse generator 8 is first applied to the ferroelectric capacitor 2. With the pulse application, a polarization state of the ferroelectric capacitor 2 is set to a first preset state.

[Step P2]

Then, a second trapezoidal voltage pulse 52 that is generated by the pulse generator 8 is applied to and across the ferroelectric capacitor 2. Voltages 54 and 56 that appear at the first and second input terminals 9a and 9b of the oscilloscope 9, are measured and viewed in their waveforms are measured and observed by the oscilloscope.

[Step P3]

The items of task done in this step are:

1) to calculate a variation of the electric field placed across the ferroelectric capacitor 2 with respect to time by using a thickness of the thin film of the ferroelectric capacitor 2 and the voltage 54;

2) to calculate a variation of the amount of the charge at the second electrode 2b of the ferroelectric capacitor 2 with respect to time when the second voltage pulse 52 is applied to the capacitor, by using the capacitance of the reference capacitor 7 and the voltage 56;

3) to obtain a relationship between the electric field applied to the ferroelectric capacitor 2 and the amount of the charge at the second electrode 2b of the ferroelectric capacitor 2; and 4) to depict a first polarization hysteresis curve 71 on the basis of the obtained relationship, with a value midway between the maximum and minimum amounts of the charge being set at a zero point of the polarization quantity of the capacitor.

[Step P4]

A third trapezoidal voltage pulse 53 that is generated by the pulse generator 8 is applied to the ferroelectric capacitor 2. With the pulse application, a polarization state of the ferroelectric capacitor 2 is set to a second predetermined state.

[Step P5]

The second voltage pulse 52 that is generated by the pulse generator 8 is applied to the ferroelectric capacitor 2. Voltages 55 and 57 that appear at the first and second input terminals 9a and 9b of the oscilloscope 9, are measured and viewed in their waveforms by the oscilloscope.

[Step P6]

The items of task done in this step are:

1) to calculate a variation of the electric field applied to the ferroelectric capacitor 2 with respect to time by using a thickness of the thin film of the ferroelectric capacitor 2 and the waveform of the voltage 55;

2) to calculate a variation of the amount of the charge at the second electrode 2b of the ferroelectric capacitor 2 with respect to time when the second voltage pulse 52 is applied to the capacitor, by using the capacitance of the reference capacitor 7 and the voltage 57;

3) to obtain a relationship between the electric field applied to the ferroelectric capacitor 2 and the amount of the charge at the second electrode 2b of the ferroelectric capacitor 2; and 4) to depict a second polarization hysteresis curve 72 on the basis of the obtained relationship, with a value halfway between the maximum and minimum amounts of the charge being set at a zero point of the polarization quantity of the capacitor.

[Step P7]

A difference between the polarization quantities 73 and 74 is calculated to obtain a nonvolatile polarization.

The conventional polarization-characteristic evaluating apparatus and method have the following disadvantages.

In the polarization-characteristic evaluating apparatus or the measuring system shown in FIG. 29, the cable 10 has a parasitic capacitance of several tens pF or larger. It is the ferroelectric capacitor of about 1 nF that can reliably be measured in its polarization characteristic while being free from the influence by the parasitic capacitance.

In analyzing the operations of the nonvolatile ferroelectric memory, a voltage pulse used must be 100 ns or shorter in pulse width. For evaluating a variation of the polarization of the ferroelectric capacitor of the memory by using the FIG. 29 measuring system, if the voltage pulse of such a short pulse width is used, a switching time is long since the parasitic capacitance of the cable is large. The long switching time may produce ringing and deformation of the waveform of the voltage pulse. In the measurement, if the voltage pulse of the deformed waveform is applied to the ferroelectric capacitor, the resultant evaluation of the nonvolatile polarization of the ferroelectric memory will be incorrect. For this reason, the use of a voltage pulse of a short pulse width is rejected by the conventional polarization-characteristic evaluating apparatus.

In the FIG. 29 evaluating apparatus, the capacitance of the reference capacitor 7 varies with frequency. The fact makes it difficult to maintain a constant capacitance over a frequency region of several MHz or higher. Therefore, the evaluation of a polarization variation of the ferroelectric capacitor by using the voltage pulse of 100 ns or shorter in pulse width will provide an unreliable evaluation result. A measurement of a variation of the polarization from a polarization state is inevitably performed in analyzing the operations of the nonvolatile ferroelectric memory. However, such a measurement is impossible when the prior polarization-characteristic evaluating apparatus is used. Meanwhile, a reliability simulation test provides an unreliable test result where the pulse width of an AC voltage pulse is different from that of a pulse applied to the ferroelectric capacitor in the memory. The polarization characteristic of the ferroelectric capacitor of the memory will be deteriorated when it undergoes a repetition of rewriting operations, which is performed by applying AC voltage pulses to the ferroelectric capacitor. To check the deterioration of the polarization characteristic of such ferroelectric capacitor, the ferroelectric capacitor is subjected to a reliability simulation test. In this test, the pulse width of the voltage pulse must be at least 100 ns, and the result is a long testing time. In the simulation test, the arbitrary-waveform pulse generator is used for a long time. The result is an increase of the number of evaluating means and the cost to evaluate.

SUMMARY OF THE INVENTION

Accordingly, an object of the present invention is to evaluate the polarization characteristic of a ferroelectric capacitor reliably and for a short time.

Another object of the present invention is to provide an apparatus for and a method of evaluating the polarization characteristic of a ferroelectric capacitor, which allow the use of a voltage pulse of 100 ns or shorter in pulse width for the evaluation.

Still another object of the present invention is to provide an apparatus for and a method of evaluating the polarization characteristic of a ferroelectric capacitor, which the apparatus and method enables a reliability simulation test for checking the deterioration of the polarization characteristic of the ferroelectric capacitor, which would result from a repetition of the polarization reversals of the ferroelectric capacitor (which are carried out by applying the AC voltage pulse to the ferroelectric capacitor).

Yet another object of the present invention is to provide an apparatus for and a method of evaluating the polarization characteristic of a ferroelectric capacitor, which the apparatus and method are each capable of evaluating the polarization characteristic of the ferroelectric capacitor by use of a voltage pulse whose pulse width is equal to that of the AC voltage pulses used for the reliability simulation test for checking the polarization characteristic deterioration.

The prior evaluating method evaluates the reversed polarization quantities of the ferroelectric capacitor when the voltage pulse is applied to the ferroelectric capacitor. The polarization characteristic is described in terms of a ferroelectric hysteresis. Hence, the quantity of the reversed polarization varies depending on a previous polarization state. Because of this nature, the operations of an FeRAM (ferroelectric RAM, nonvolatile ferroelectric memory) can not be accurately analyzed.

Accordingly, an object of the present invention is to provide a method of evaluating the polarization characteristic of a ferroelectric capacitor, the method being capable of evaluating a quantity of polarization reversal caused by applying a voltage pulse to the ferroelectric capacitor while being not affected by the past polarization state.

A further object of the present invention is to provide a method of evaluating the polarization characteristic of a ferroelectric capacitor, the method being capable of handling a polarization state read out of the ferroelectric capacitor that was insufficiently polarized for writing, viz., capable of evaluating a quantity of polarization reversal of the ferroelectric capacitor produced when a voltage pulse is applied to a ferroelectric capacitor having in a medium polarization state.

A first aspect of the present invention provides an apparatus for evaluating the polarization characteristic of a ferroelectric capacitor, the apparatus comprising: a ferroelectric capacitor; a first pulse generator; a second pulse generator; a reference capacitor of a known capacitance value; and switch means, the electronic circuit elements and components being all fabricated into a semiconductor substrate. In the apparatus, the first and second electrodes of the ferroelectric capacitor are connected to the output terminals of the first and second pulse generators. The second electrode of the ferroelectric capacitor is connected to a first electrode of the reference capacitor through the switch means.

According to the first aspect, the parasitic capacitance formed around the wires connecting the pulse generators to the ferroelectric capacitor is reduced. Therefore, a voltage pulse of 100 ns or shorter in pulse width can be applied to the ferroelectric capacitor with no problem. The polarization characteristic is evaluated highly accurately and at high speed.

The polarization characteristic evaluating apparatus of a second aspect is characterized in that one of the voltage pulses output from the first and second pulse generators is adjustable in its pulse width.

With this technical feature, it is very easy to apply a pulse with a proper pulse width to the ferroelectric capacitor. If a pulse with of a short pulse width is applied thereto, no ringing problem arises.

The polarization characteristic evaluating apparatus of a third aspect further includes an oscillator fabricated into the semiconductor substrate. The oscillator is connected at the first out put terminal to the first electrode of the ferroelectric capacitor, and at the second output terminal to the second electrode of the ferroelectric capacitor.

A fourth aspect specifies the polarization-characteristic evaluating apparatus of the third aspect such that the output terminal of the first pulse generator and the first output terminal of the oscillator are both connected to the ferroelectric capacitor through a buffer, and the output terminal of the second pulse generator and the second output terminal of the oscillator are both connected to the ferroelectric capacitor through another buffer.

This feature allows one to evaluate a polarization characteristic of the ferroelectric capacitor by using a voltage pulse whose waveform is the same as of a voltage pulse used for a reliability simulation test for polarization characteristic deterioration.

A fifth aspect specifically defines the polarization characteristic evaluating apparatus of the first or second aspect includes an oscillator being connected at the first output terminal to a trigger terminal of the first pulse generator, and at the second output terminal to a trigger terminal of the second pulse generator.

Therefore, a reliability simulation test using AC voltage pulses can be conducted not using the arbitrary waveform pulse generator. The parasitic capacitance formed around the wires connecting the oscillator to the ferroelectric capacitor is reduced. Therefore, a voltage pulse of 100 ns or shorter in pulse width can be applied to the ferroelectric capacitor with no problem. The AC pulse based reliability simulation test can be conducted for a short time.

A sixth aspect specifically defines the polarization characteristic evaluating apparatus of the fifth aspect such that the oscillator is provided outside the semiconductor substrate.

Therefore, the oscillator is formed on and in a semiconductor substrate, which is different from the semiconductor substrate into which the integrated circuit of the polarization-characteristic evaluating apparatus is fabricated. There is eliminated a measuring error arising from heating of the oscillator.

A seventh aspect specifies the polarization characteristic evaluating apparatus of the sixth aspect such that the oscillator and the substrate are both assembled in one package.

Since the oscillator and the substrate are both assembled in one package, the wires connecting the output terminal of the oscillator to the trigger signal input terminal of the pulse generators are reduced in length. This allows use of an AC voltage of high frequency, and the polarization-characteristic evaluating apparatus is reduced in size.

An eighth aspect specifically defines the polarization characteristic evaluating apparatus of the third to seventh aspect such that the frequency of an output signal of the oscillator is variable.

A ninth aspect provides a method of driving an apparatus for evaluating the polarization characteristic of a ferroelectric capacitor, the apparatus including a ferroelectric capacitor, a first pulse generator, a second pulse generator, and a reference capacitor of a known capacitance value, the capacitors and generators being all formed on a semiconductor substrate, the method comprising the steps of: applying a first voltage pulse to one of the first and second electrodes of the ferroelectric capacitor for the polarization reversal of the ferroelectric capacitor; connecting the second electrode of the ferroelectric capacitor to the first electrode of the reference capacitor; measuring a potential variation at the first electrode of the reference capacitor when a second voltage pulse is applied to the first electrode of the ferroelectric capacitor in a state that a fixed voltage is applied to the second electrode of the reference capacitor; and calculating a variation of the amount of charge at the second electrode of the ferroelectric capacitor in the potential variation measuring step by using a potential variation measured in the potential variation measuring step, and the capacitance value of the reference capacitor.

With this, a voltage pulse of 100 ns or shorter can be used for evaluation of the polarization characteristic of the ferroelectric capacitor while being not adversely affected by the frequency characteristic of the reference capacitor.

A tenth aspect provides a method of driving an apparatus for evaluating the polarization characteristic of a ferroelectric capacitor the method comprising the steps of: reversing the polarization in the ferroelectric capacitor by applying a first voltage pulse to one of the first and second electrodes of the ferroelectric capacitor; connecting the second electrode of the ferroelectric capacitor to the first electrode of the reference capacitor; measuring a potential variation at the first electrode of the reference capacitor when a second voltage pulse is applied to the first electrode of the ferroelectric capacitor in a state that a fixed voltage is applied to the second electrode of the reference capacitor; calculating a variation of the amount of charge at the second electrode of the ferroelectric capacitor in the potential variation measuring step by using a potential variation measured in the potential variation measuring step, and the capacitance value of the reference capacitor; and initializing the polarization of the ferroelectric capacitor by applying a third voltage pulse to one of the first and second electrodes of the ferroelectric capacitor before the polarization reversing step.

Since the polarization-characteristic evaluating method of the aspect includes a polarization initializing step, the quantity of the polarization reversal in the ferroelectric capacitor when a voltage pulse is applied thereto can be evaluated while being free from the past polarization state.

An eleventh aspect specifies the polarization characteristic evaluating method of the tenth aspect such that the method further includes the step of setting up a polarization in the ferroelectric capacitor, the polarization set-up step being located between the polarization reversing step and the polarization initializing step.

Since the polarization-characteristic evaluating method includes a polarization setting step, the method can handle the read-out operation from the FeRAM being in an insufficiently written state. In other words, the quantity of the polarization reversal can be evaluated by applying a pulse to the ferroelectric memory cell being in a medium polarization state.

A twelfth aspect specifically defines the polarization characteristic evaluating method of the tenth or eleventh aspect such that the method further includes the step of changing the pulse width of the first voltage pulse.

A thirteenth aspect specifically defines the polarization characteristic evaluating method of any of the tenth to twelfth aspects such that the method further includes the step of changing an amplitude of the first voltage pulse.

BRIEF DESCRIPTION OF THE DRAWINGS

FIG. 17 is a graph showing a polarization characteristic of the ferroelectric capacitor, measured by the FIG. 1 apparatus.

FIG. 18 is a graph showing another polarization characteristic of the ferroelectric capacitor, measured by the polarization-characteristic evaluating apparatus of the second embodiment.

DESCRIPTION OF THE PREFERRED EMBODIMENTS

Figure 1:
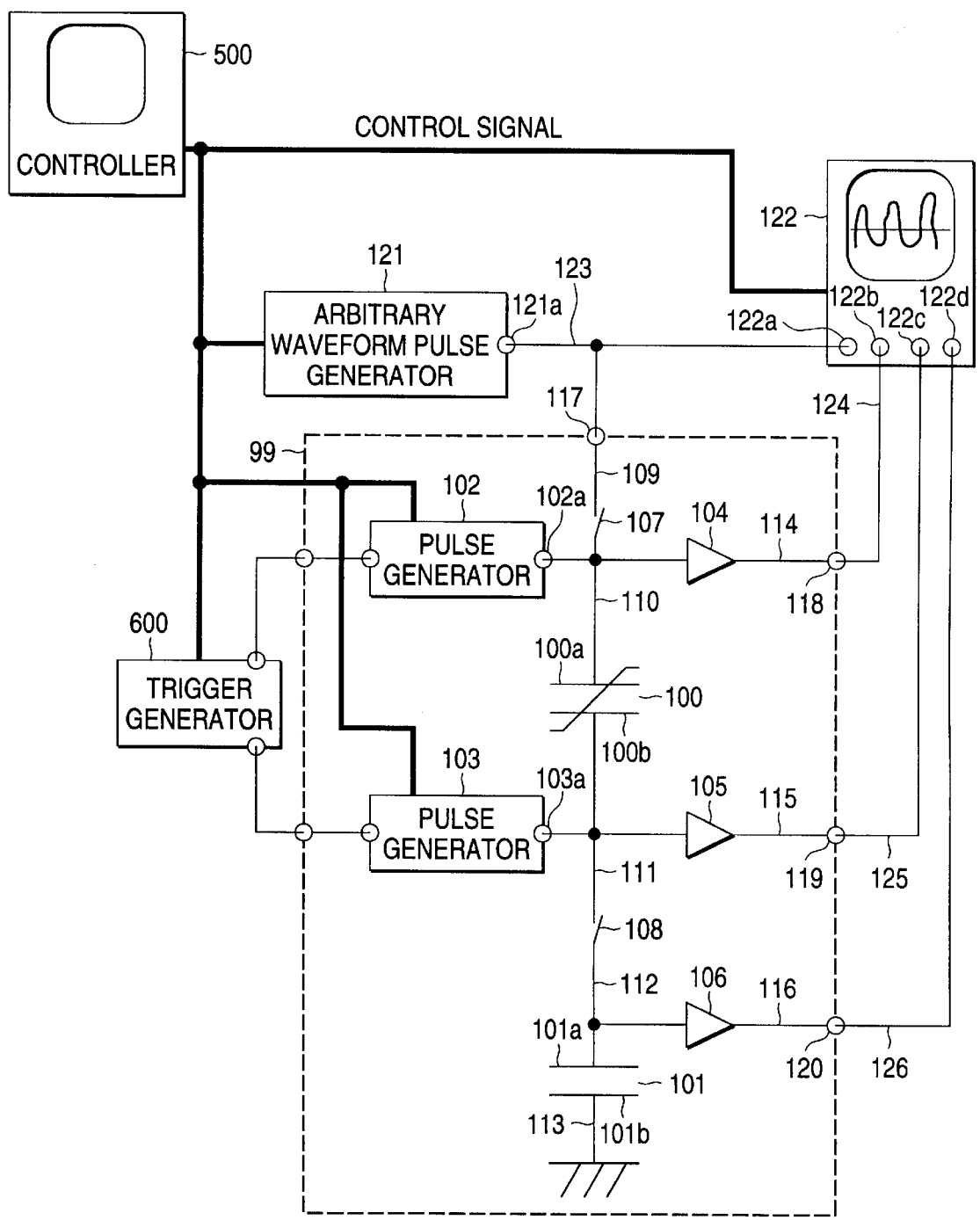
FIG. 1 diagrams an exemplar apparatus for evaluating the polarization characteristic of a ferroelectric capacitor, which constitutes a first embodiment of the present invention.

An apparatus for evaluating the polarization characteristic of a ferroelectric capacitor, which is a first embodiment of the present invention, is arranged as shown in FIG. 1. In the figure, reference numeral 99 is a semiconductor substrate; 100 is a ferroelectric capacitor to be measured; 101 is a reference capacitor whose capacitance is known; 102 is a first pulse generator; 103 is a second pulse generator; 104 and 105 are buffers; 106 is an impedance converter; 107 and 108 are electrical switches; 109 to 116 are wires; 117 to 120 are pads; 121 is an arbitrary pulse generator for generating a pulse signal of a proper waveform; 122 is an oscilloscope; 123 to 126 are cables; 500 is a controller; and 600 is a trigger generator.

The ferroelectric capacitor 100, reference capacitor 101, first pulse generator 102, second pulse generator 103, buffers 104 to 105, impedance converter 106, electrical switches 107 and 108, wires 109 to 116, and pads 117 to 120 are all formed on and in the semiconductor substrate 99. First and second electrodes 100a and 100b of the ferroelectric capacitor 100 are, respectively, interconnected to the output terminals and 102a and 103a of the first and second pulse generators 102 and 103. The second electrode 100b of the ferroelectric capacitor 100 is further connected to the first electrode 101a of the reference capacitor 101 whose capacitance has known, through the electrical switch 108. The pulse generator 121 has an output terminal 121a, and the oscilloscope 122 has first to fourth input terminal 122a to 122d.

One of the first and second pulse generators 102 and 103 is designed so that the pulse width of a voltage pulse is adjustable. The pulse generators 102 and 103, pulse generator 121, oscilloscope 122, and trigger generator 600 are under control of the trigger generator 600.

Description will be given how the apparatus for evaluating the polarization characteristic of a ferroelectric capacitor (referred frequently to as a polarization-characteristic evaluating apparatus) evaluates the polarization characteristic of a ferroelectric capacitor. Before description of the evaluating method by the apparatus, the figures to be referred to in the description will be described.

Figure 2:
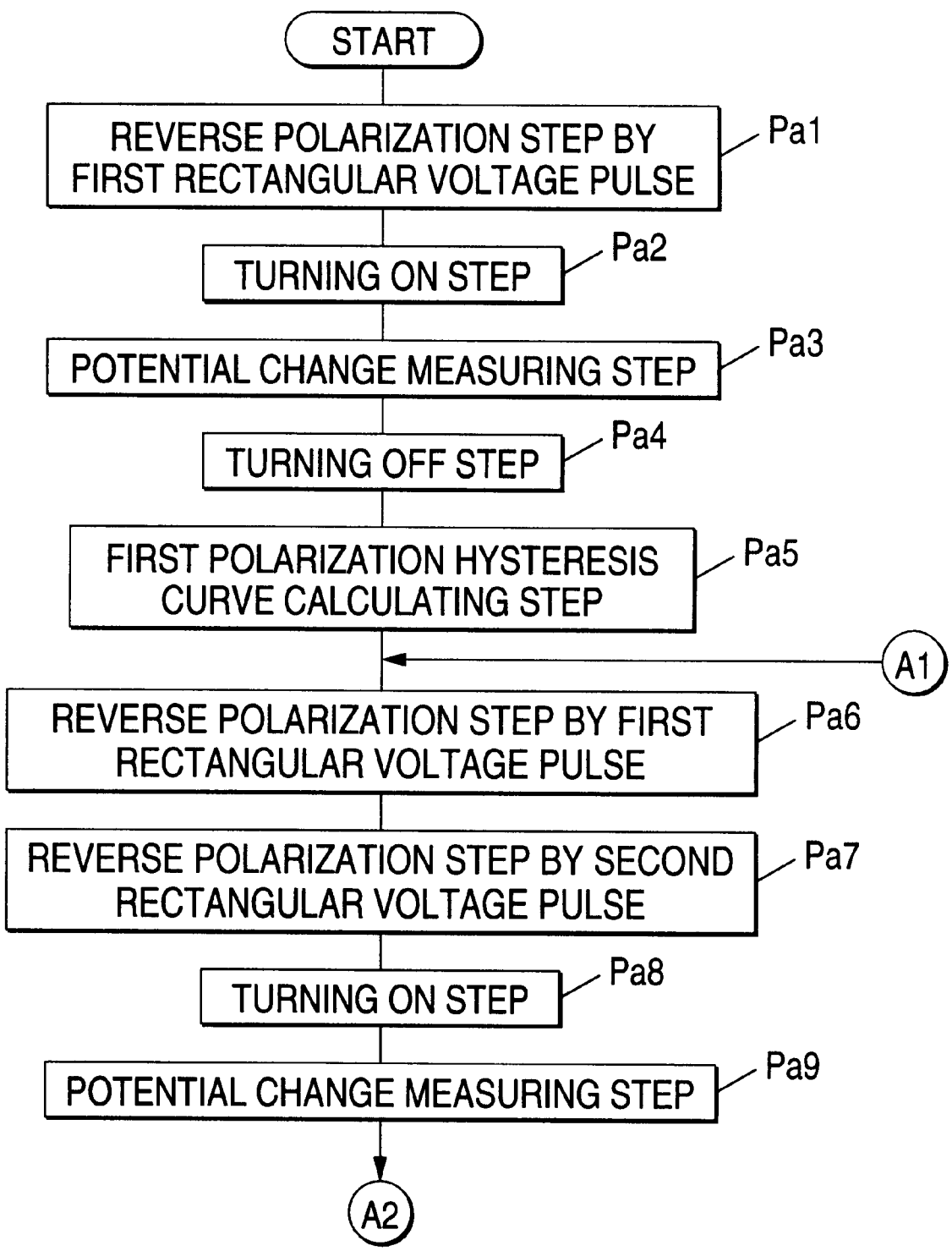
FIG. 2 depicts a flow chart showing how the polarization-characteristic evaluating apparatus of FIG. 1 evaluates the polarization characteristic of a ferroelectric capacitor.
Figure 3:
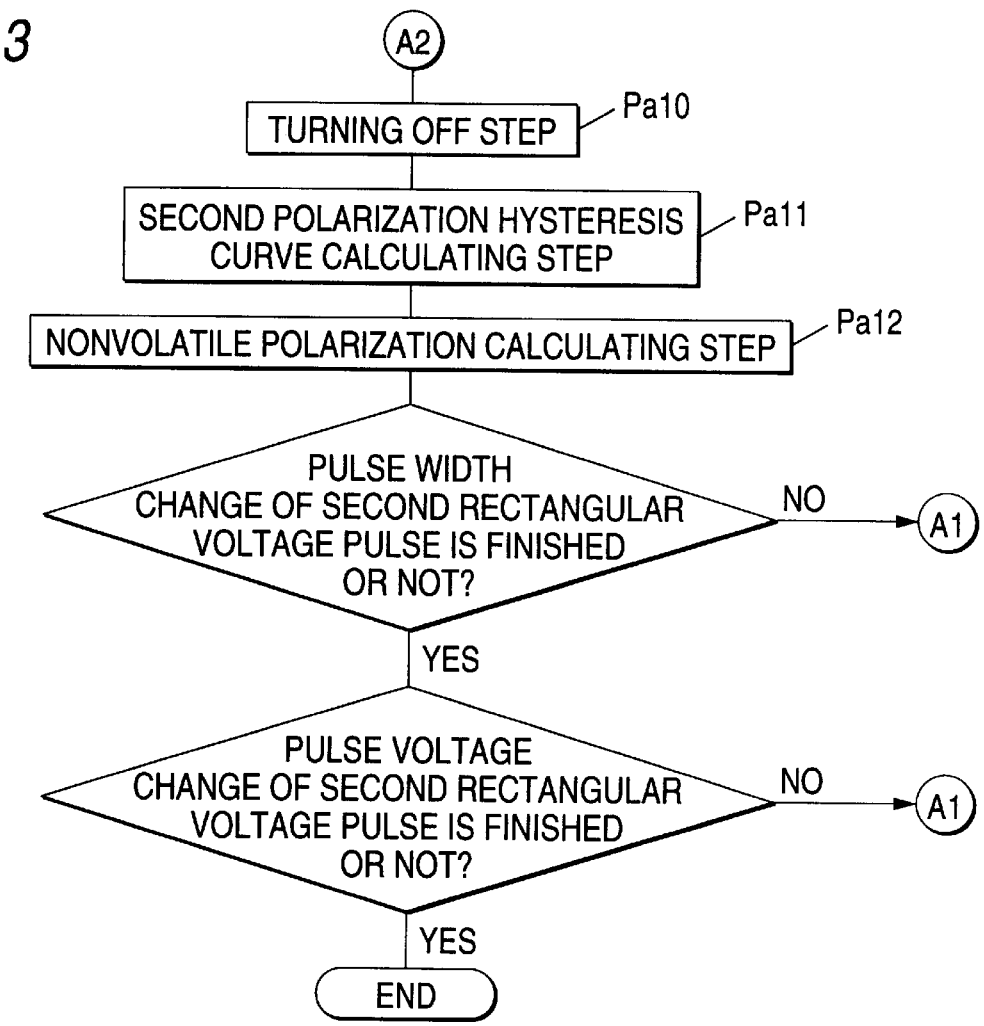
FIG. 3 depicts a flow chart showing the polarization-characteristic evaluating method, continued from the FIG. 1 flow chart.

FIGS. 2 and 3 cooperate to show a method of evaluating the polarization characteristic of a ferroelectric capacitor (referred frequently to as a polarization-characteristic evaluating method).

Figure 4:
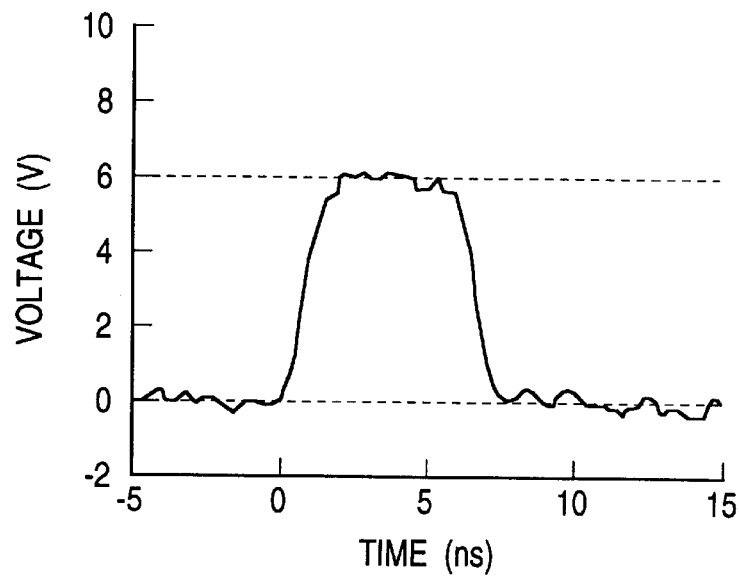
FIG. 4 is a waveform diagram showing the waveform of a voltage pulse applied to a ferroelectric capacitor in the FIG. 1 apparatus, the waveform being observed by an electron beam tester.

FIG. 4 depicts the waveform of a voltage pulse applied to a ferroelectric capacitor in the FIG. 1 apparatus. The waveform illustrated was observed by an electron beam tester. Specifically, a voltage pulse that is generated by the second pulse generator 103 is applied to the ferroelectric capacitor 100, and the waveform of the pulse is measured at the second electrode 100b of the ferroelectric capacitor 100.

Figure 5:
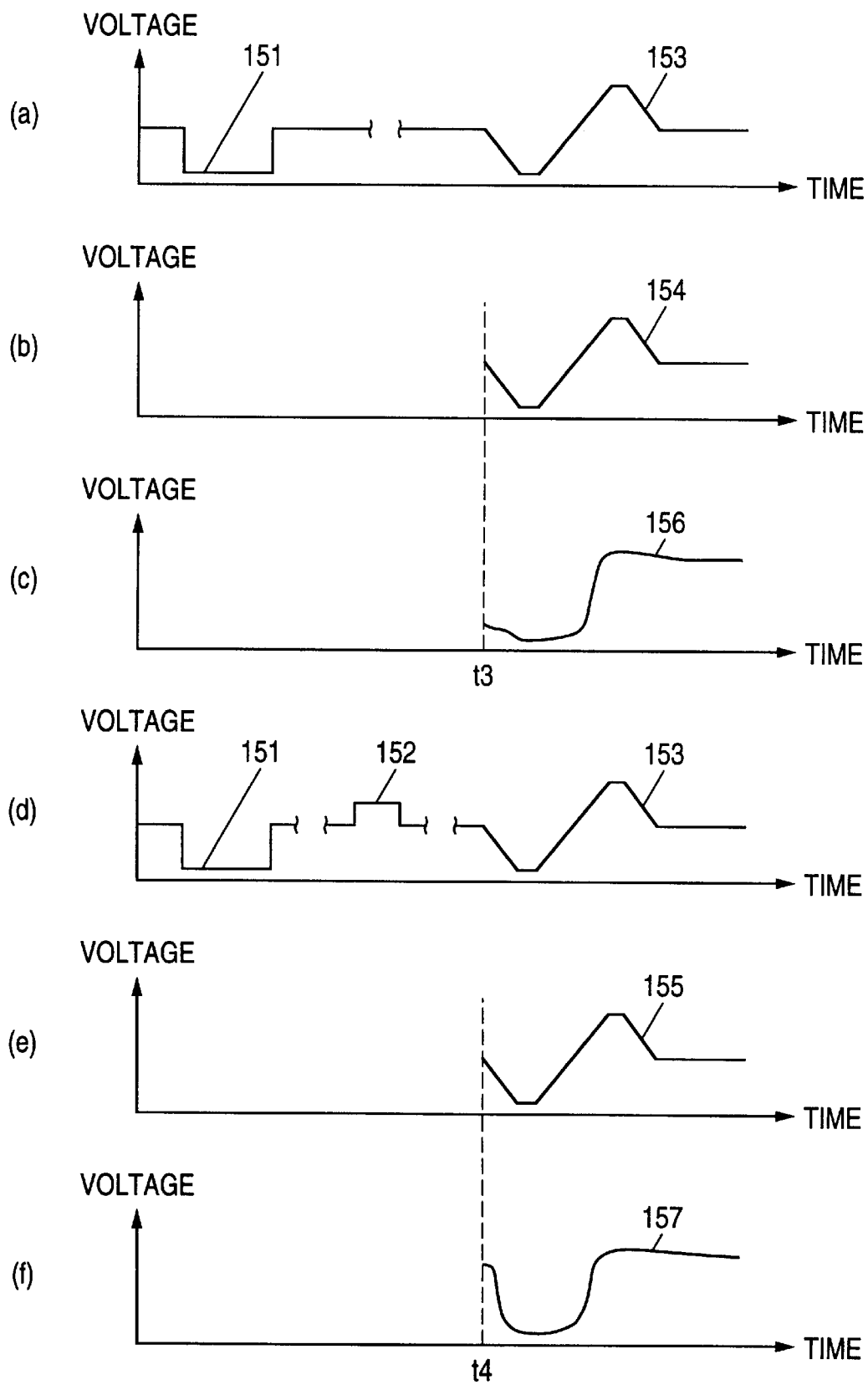
FIG. 5 is a waveform diagram showing the waveforms of voltage pulses applied to the ferroelectric capacitor and of voltages observed by the oscilloscope in the FIG. 1 apparatus.

FIG. 5 depicts the waveforms of voltage pulses applied to the ferroelectric capacitor and of voltages measured and observed by an oscilloscope in the polarization-characteristic evaluating apparatus. In FIG. 5, (a) and (d) are the waveforms of voltage pulses produced by the first and second pulse generators 102 and 103 and the pulse generator 121; (b) and (e) are the waveforms of the voltages appearing at the first input terminal 122a of the oscilloscope 122 and measured by the oscilloscope; and (c) and (f) are the waveforms of the voltages appearing at the second input terminal 122b of the oscilloscope and measured by the oscilloscope. Also in the same figure, reference numeral 151 is a voltage pulse having a rectangular waveform generated by the first pulse generator 102; 152 is a voltage pulse having a rectangular waveform generated by the second pulse generator 103; 153 is a voltage pulse generated by the pulse generator 121; 154 and 155 are voltages appearing at the first input terminal 122a of the oscilloscope 122 and measured by the same; and 156 and 157 are voltages appearing at the second input terminal 122b of the oscilloscope and measured by the same. Further, t3 indicates a time point where the voltage 154 starts to vary, and t4 represents a timepoint where the voltage 155 starts to vary.

Figure 6:
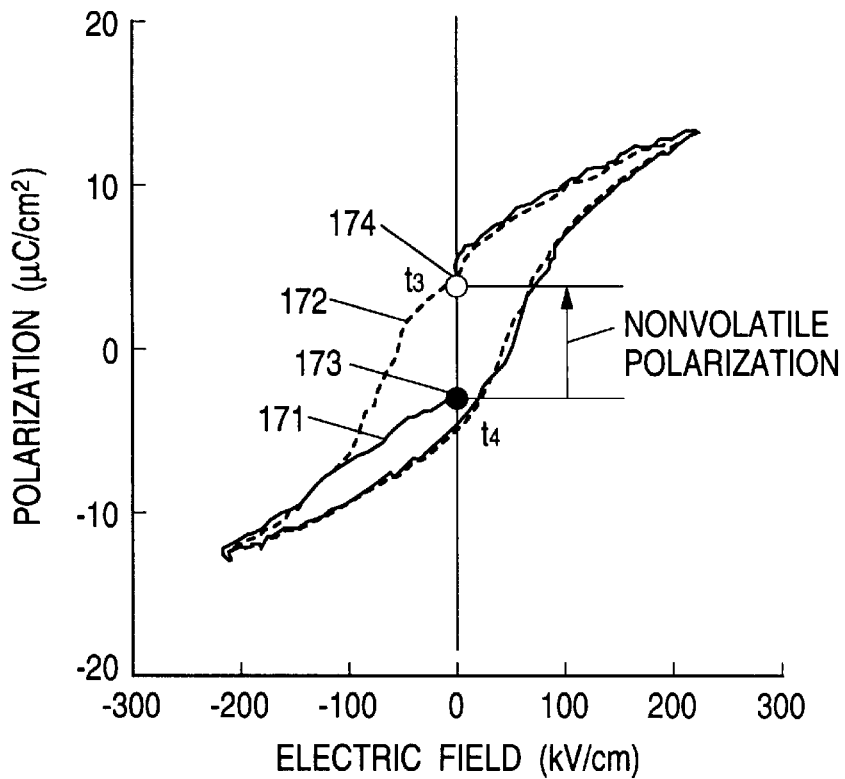
FIG. 6 is a graph showing a polarization characteristic of the ferroelectric capacitor, measured by the FIG. 1 apparatus.

FIG. 6 is a graph showing a polarization characteristic of the ferroelectric capacitor, measured by the polarization-characteristic evaluating apparatus. In the figure, numerals 171 and 172 are polarization hysteresis curves; 173 is a quantity of polarization at time point t3; and 174 is a quantity of polarization at time point t4.

Figure 7:
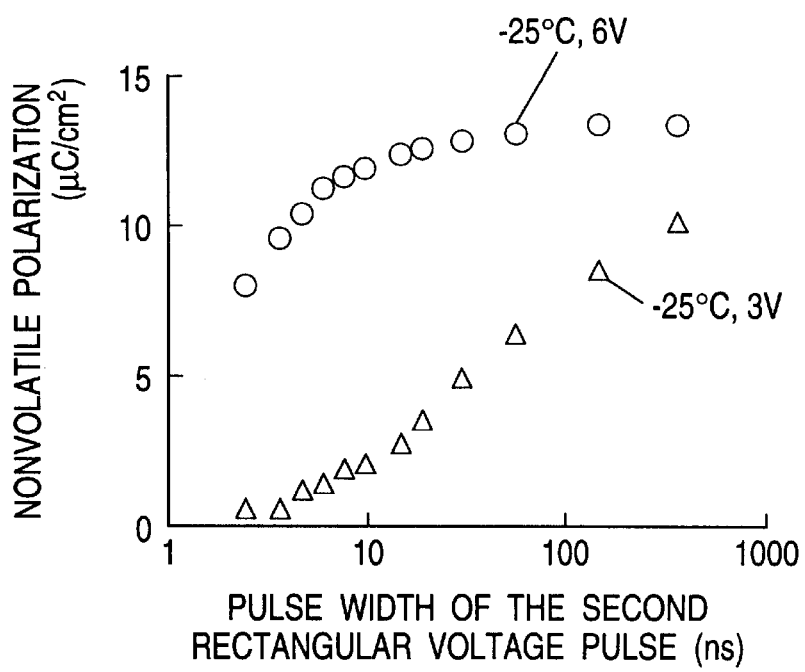
FIG. 7 is a graph showing the pulse-width dependency and the pulse-voltage dependency of the nonvolatile polarization, measured by the FIG. 1 apparatus.
Figure 8:
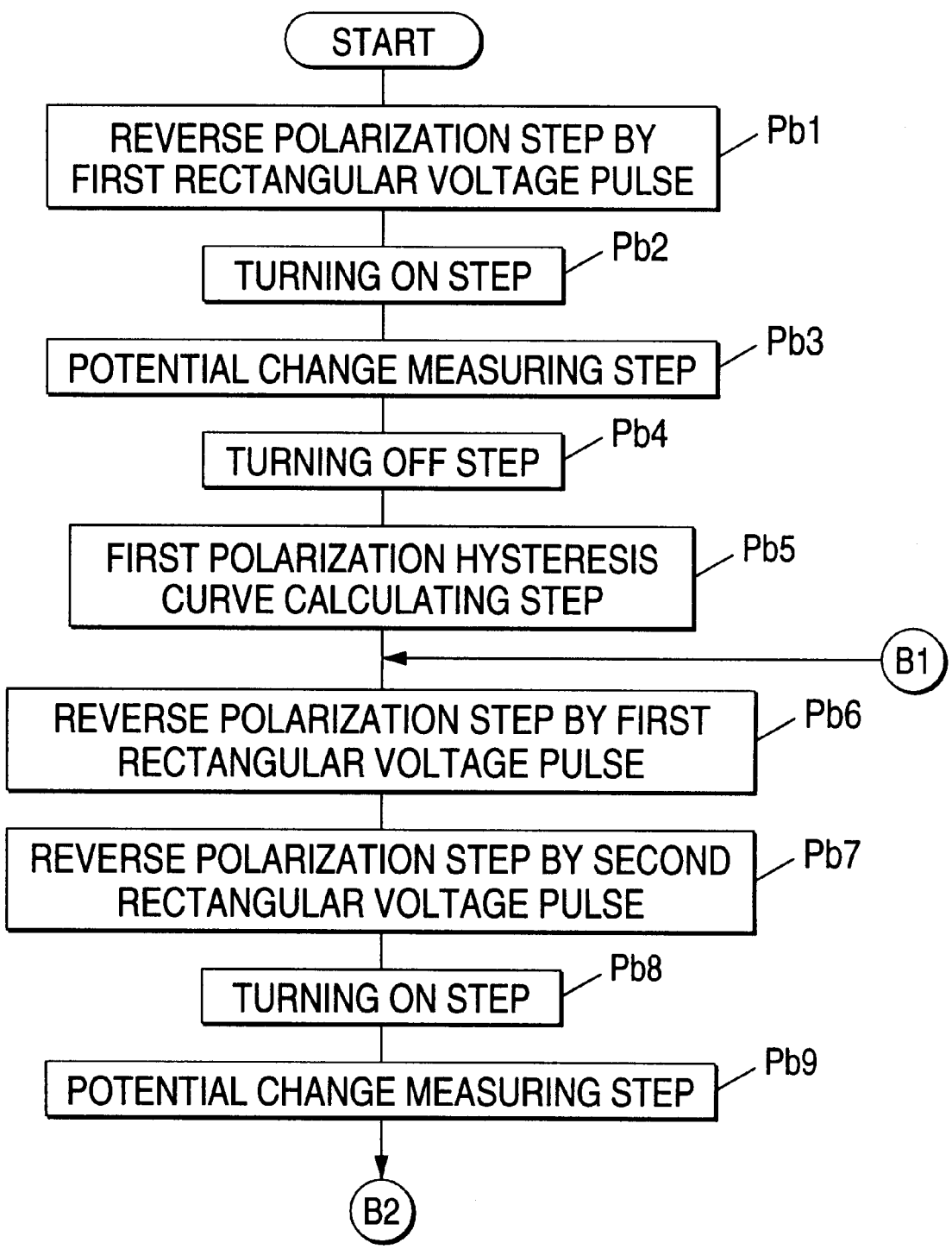
FIG. 8 is a flow chart showing another method of evaluating the polarization characteristic of a ferroelectric capacitor, by which the apparatus evaluates the polarization characteristic, the method forming a second embodiment of the present invention.
Figure 9:
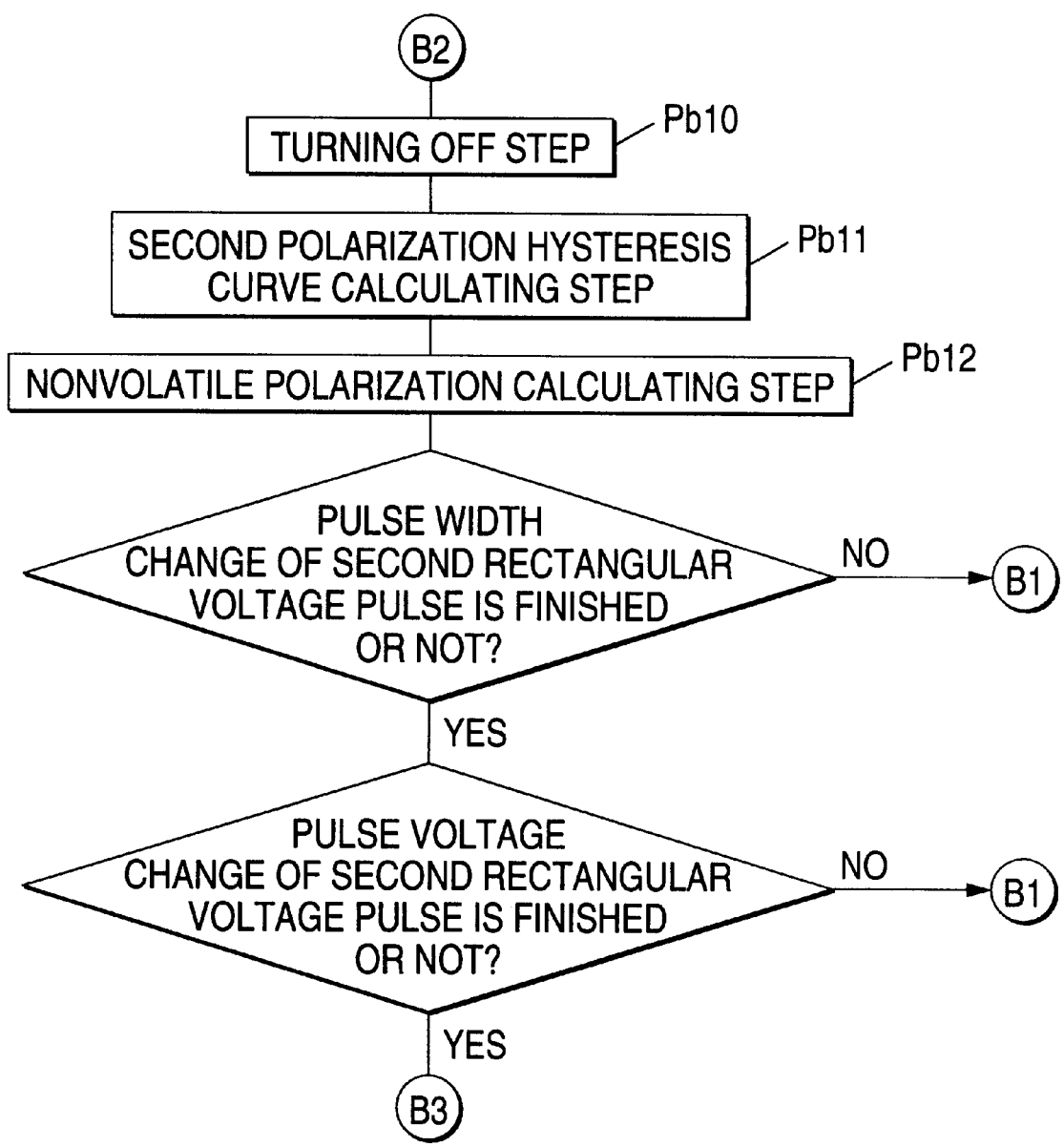
FIG. 9 is a flow chart showing the polarization-characteristic evaluating method, continued from the FIG. 8 flow chart.
Figure 10:
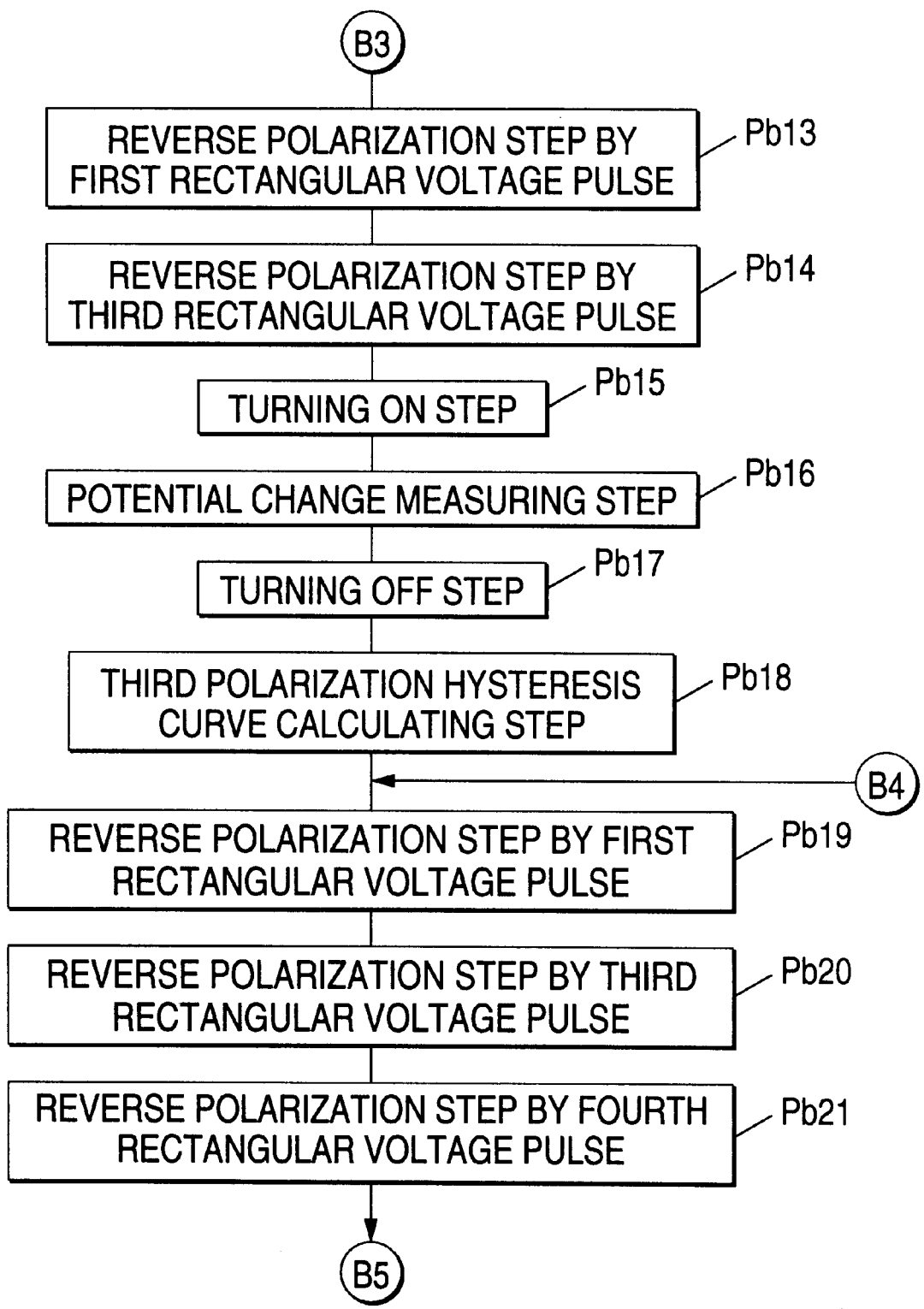
FIG. 10 is a flow chart showing the polarization-characteristic evaluating method, continued from the FIG. 9 flow chart.
Figure 11:
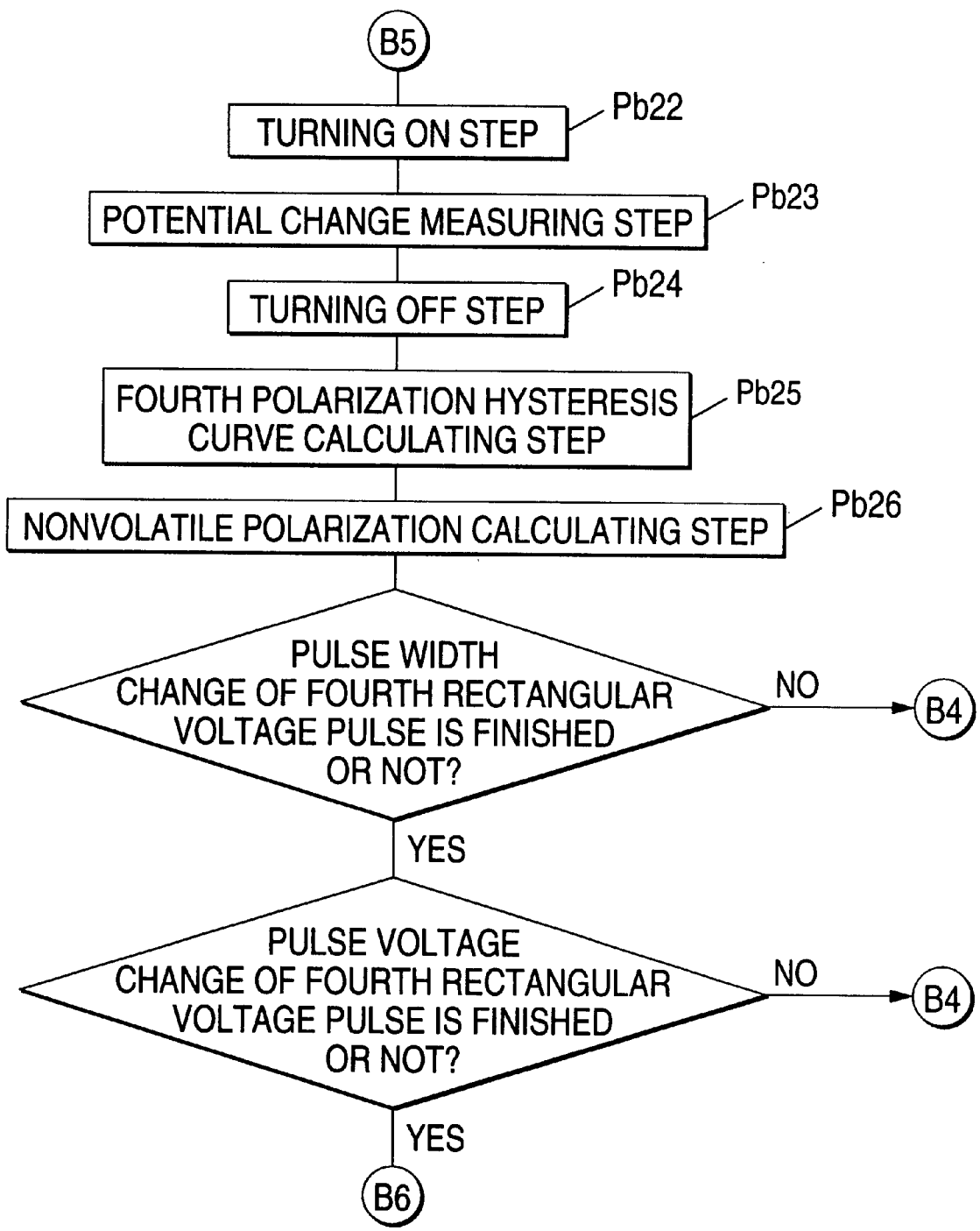
FIG. 11 is a flow chart showing the polarization-characteristic evaluating method, continued from the FIG. 10 flow chart.
Figure 12:
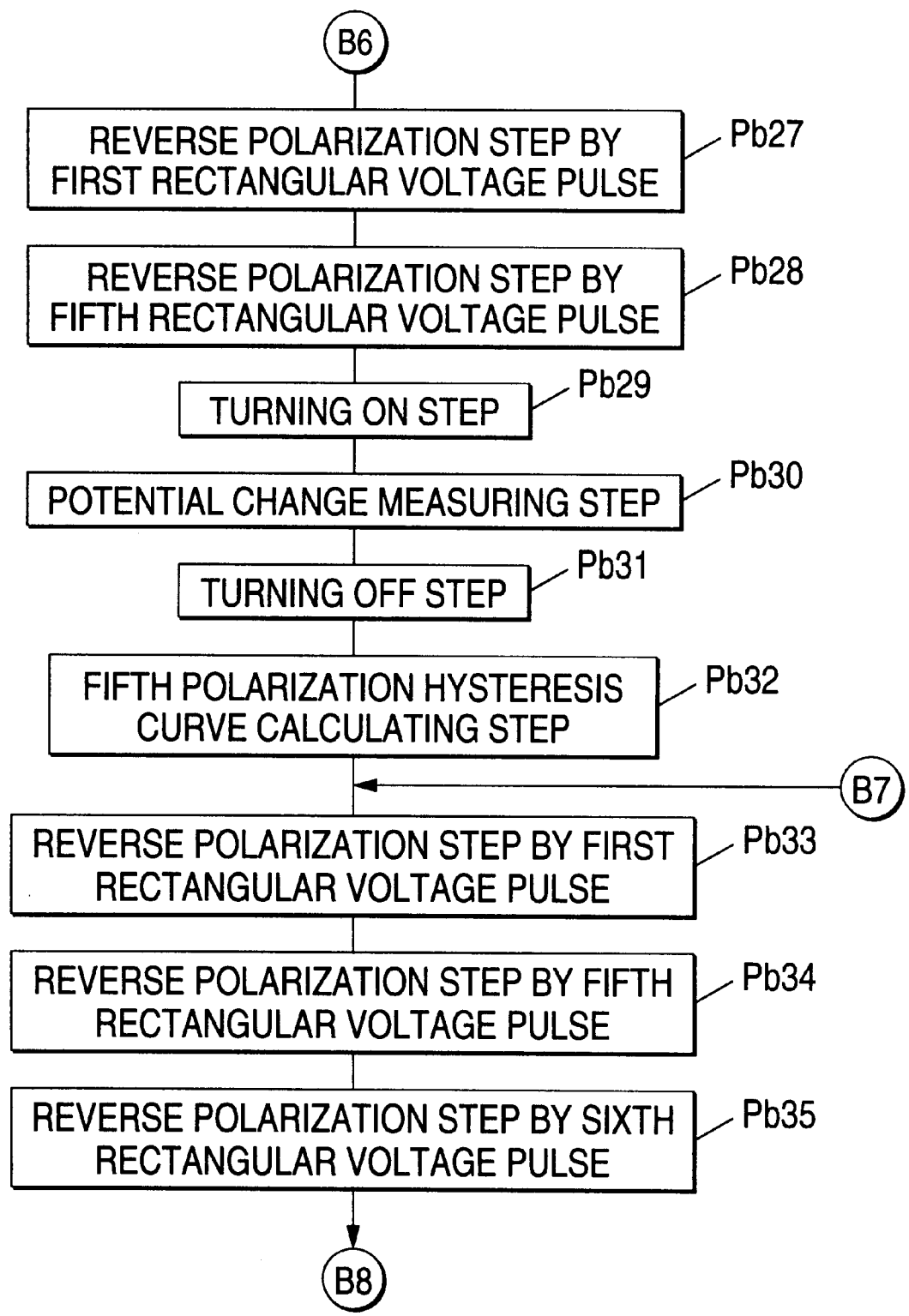
FIG. 12 is a flow chart showing the polarization-characteristic evaluating method, continued from the FIG. 11 flow chart.
Figure 13:
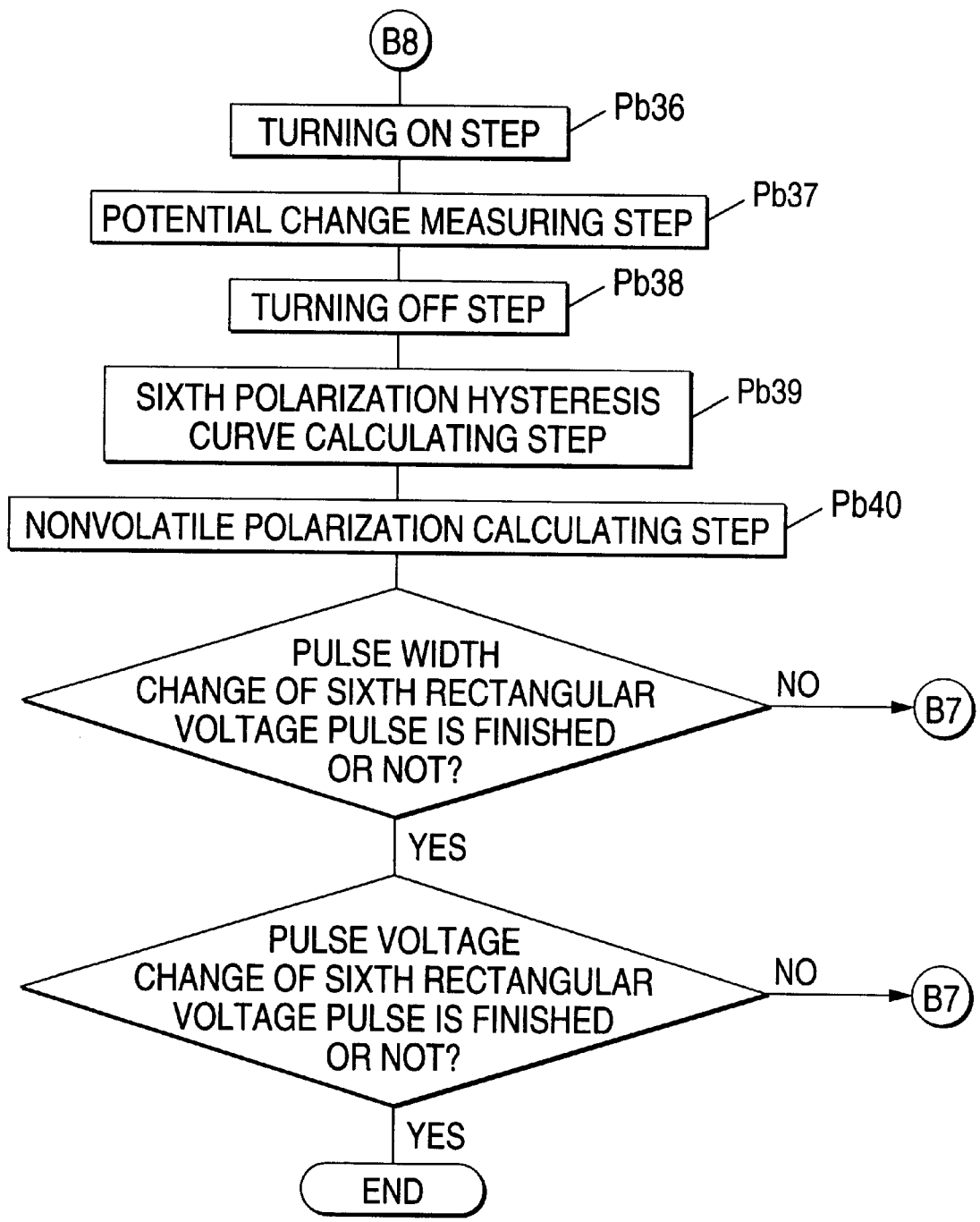
FIG. 13 is a flow chart showing the polarization-characteristic evaluating method, continued from the FIG. 12 flow chart.

FIG. 7 is a graph showing the pulse-width dependency and the pulse-voltage dependency of the nonvolatile polarization, measured by the polarization-characteristic evaluating apparatus. Reference is made to FIGS. 2 and 3 showing a flow chart of the polarization-characteristic evaluating method executed by the FIG. 1 apparatus.

[Step Pa1]

The trigger generator 600 is driven and in turn the second pulse generator 103 is driven, by the trigger generator, to generate a first rectangular (waveform) voltage pulse 151 for application to the ferroelectric capacitor 100. By the voltage pulse, a polarization state of the ferroelectric capacitor is set to a predetermined polarization state. The switches 107 and 108 are in an off state.

[Step Pa2]

The switches 107 and 108 are turned on.

[Step Pa3]

A voltage pulse 153 that is generated by the pulse generator 121 is applied to the ferroelectric capacitor 100. The voltage 154, which appears at the first input terminal 122a of the oscilloscope 122, is measured in its waveform by the oscilloscope. Further, a voltage 156, which appears at the fourth input terminal 122d of the oscilloscope 122, is measured in its waveform by the oscilloscope.

[Step Pa4]

The switches 107 and 108 are turned off.

[Step Pa5]

This step is for obtaining a first polarization hysteresis curve and to this end, the following items of task are carried out:

1) to calculate a variation of an electric field applied to the ferroelectric capacitor 100 with respect to time by using the thickness of a thin film of the ferroelectric capacitor 100 and the voltage 154;

2) to calculate a variation of an amount of charge at the second electrode 100b of the ferroelectric capacitor 100 (when the voltage pulse 153 is applied thereto) with respect to time by using a capacitance of the reference capacitor 101 and the waveform of the voltage 156;

3) to obtain a relationship between the electric field applied to the ferroelectric capacitor 100 and the amount of charge at the second electrode 100b of the ferroelectric capacitor 100; and 4) to depict a first polarization hysteresis curve 171 on the basis of the above relationship (in this case, a value halfway between the maximum and minimum values of the charge amount is set at a zero point of polarization quantity).

[Step Pa6]

The first voltage pulse 151 rectangular in waveform that is generated by the second pulse generator 103 is applied to the ferroelectric capacitor. As a result, a polarization state is set to a predetermined polarization state.

[Step Pa7]

A second voltage pulse 152 also rectangular in waveshape is applied to the ferroelectric capacitor 100. In this state, a polarization state in the ferroelectric capacitor 100 varies depending on the pulse width and the pulse voltage of the second rectangular voltage pulse 152.

[Step Pa8]

The switches 107 and 108 are turned on.

[Step Pa9]

A trapezoidal voltage pulse 153 that is generated by the pulse generator 121 is applied to the ferroelectric capacitor 100. The voltage 155, which appears at the first input terminal 122a of the oscilloscope 122, is measured by the oscilloscope. Further, the voltage 157, which appears at the fourth input terminal 122d of the oscilloscope 122, is measured by the oscilloscope.

[Step Pa10]

The switches 107 and 108 are turned off.

[Step Pa11]

In this step, to depict a second polarization hysteresis curve, the following items of task are carried out:

1) to calculate a variation of an electric field applied to the ferroelectric capacitor 100 with respect to time by using the thickness of a thin film of the ferroelectric capacitor 100 and the voltage 155;
2) to calculate a variation of an amount of charge at the second electrode 100b of the ferroelectric capacitor 100 (when the voltage pulse 153 is applied thereto) with respect to time by using a capacitance of the reference capacitor 101 and the waveform of the voltage 157;
3) to obtain a relationship between the electric field applied to the ferroelectric capacitor 100 and the amount of charge at the second electrode 100b of the ferroelectric capacitor 100; and
4) to depict a second polarization hysteresis curve 172 defining the above relationship (in this case, a value halfway between the maximum and minimum values of the charge amount is set at a zero point of polarization quantity).

[Step Pa12]

A difference between the polarization quantities 173 and 174 is calculated to obtain a nonvolatile polarization.

It is noted that the wires 110 and 111 are formed on the semiconductor substrate 99 in the polarization-characteristic evaluating apparatus of FIG. 1. Therefore, the capacitance formed around those wires is small. The arrangement and structure of the polarization-characteristic evaluating apparatus of the embodiment allows a voltage pulse of 100 ns or shorter in pulse width (generated by the first or second pulse generator 102 or 103 (FIG. 4)) to be applied to the ferroelectric capacitor. The pulse width dependency and the pulse voltage dependency of the nonvolatile polarization (FIG. 7) can be evaluated which is essential to the analyzing of the operations of the FeRAM. To evaluate those factors, the nonvolatile polarization is measured by varying the pulse width and the pulse voltage of the second rectangular voltage pulse 152.

The first voltage pulse 151 generated by the second pulse generator 103 has a rectangular waveform as shown in FIG. 5. Any of trapezoidal, triangular, and sine waveforms may be used in place of the rectangular waveform, if required. The voltage pulse 153 generated by the pulse generator 121 has a trapezoidal waveform as shown in FIG. 5, but it may take any of triangular, sine and rectangular waveforms in place of the trapezoidal one.

Another method of evaluating the polarization characteristic of a ferroelectric capacitor will now be described as a second embodiment of the present invention. The polarization-characteristic evaluating apparatus for executing the polarization-characteristic evaluating method is exactly the same arrangement and structure as of the first embodiment.

FIGS. 8 to 13 are flow charts showing another method of evaluating the polarization characteristic of a ferroelectric capacitor, by which the apparatus evaluates the polarization characteristic, the method forming a second embodiment of the present invention.

Figure 14:
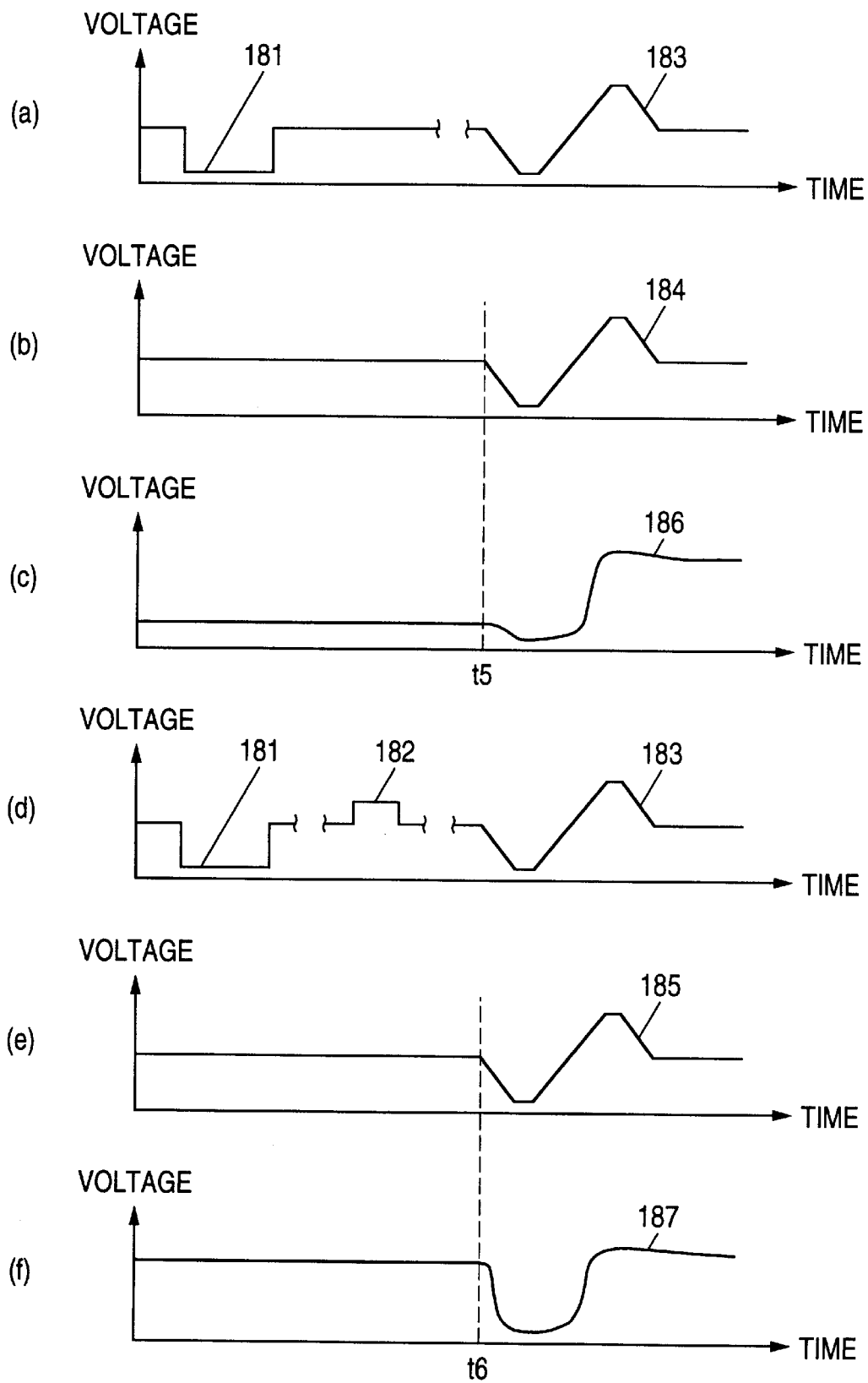
FIG. 14 is a waveform diagram showing the waveforms of voltage pulses applied to the ferroelectric capacitor and of voltages observed by an oscilloscope in the FIG. 1 apparatus, those pulses and voltages being used in evaluating the polarization characteristic of a ferroelectric capacitor by the FIG. 1 apparatus.
Figure 15:
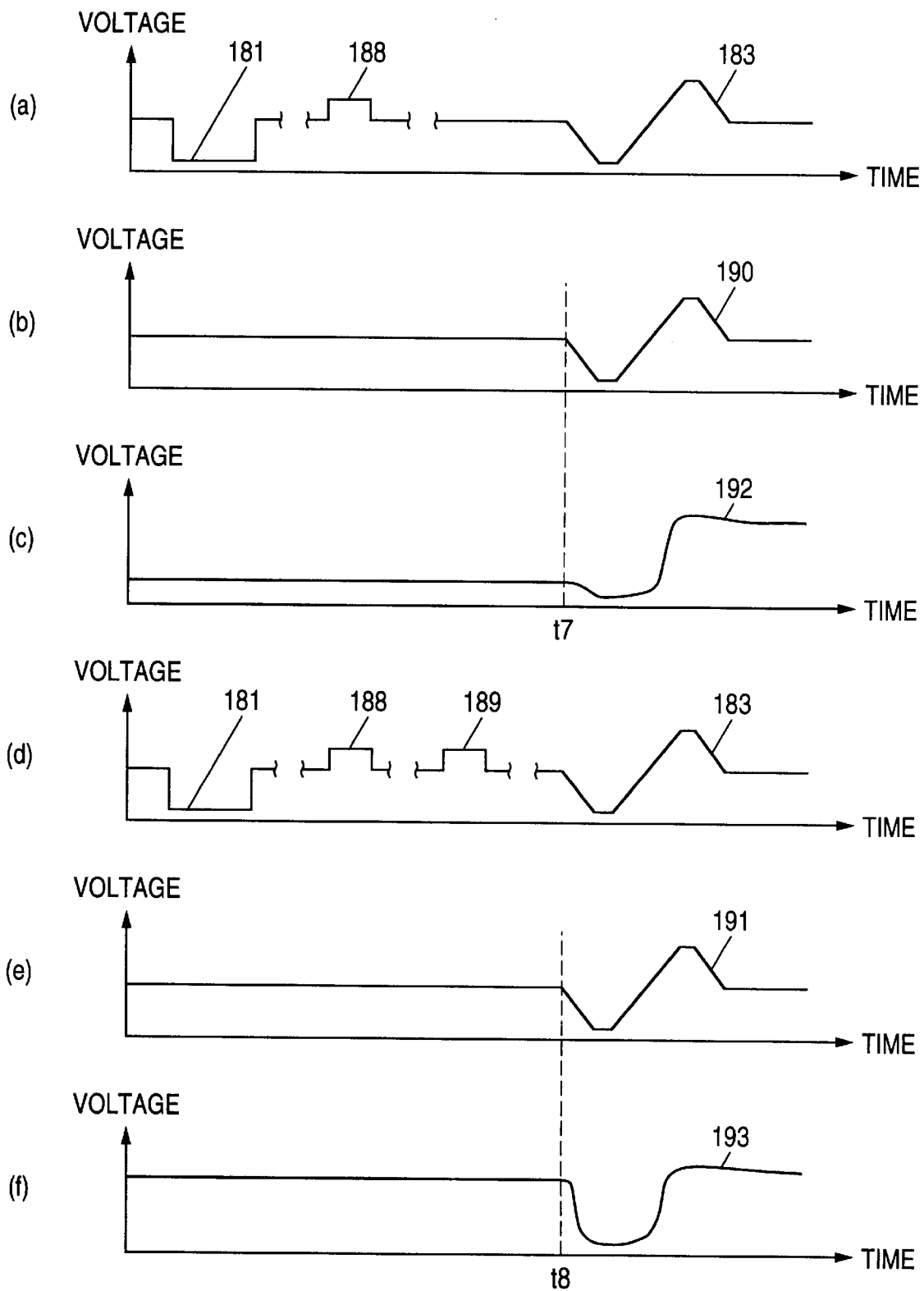
FIG. 15 is another waveform diagram showing the waveforms of voltage pulses applied to the ferroelectric capacitor and of voltages observed by the oscilloscope.
Figure 16:
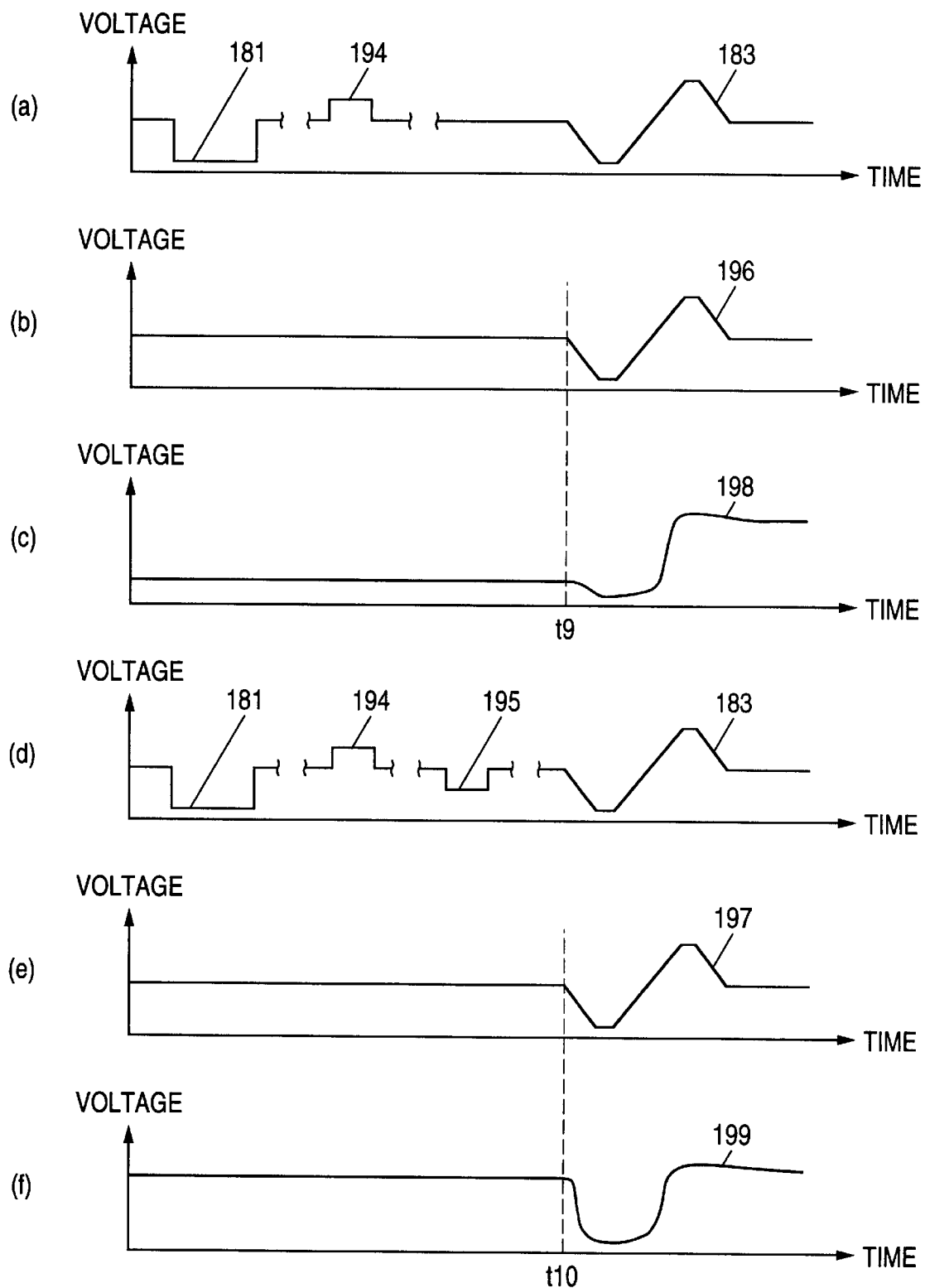
FIG. 16 is still another waveform diagram showing the waveforms of voltage pulses applied to the ferroelectric capacitor and of voltages observed by the oscilloscope.

FIGS. 14 to 16 are waveform diagrams showing the waveforms of voltage pulses applied to the ferroelectric capacitor and of voltages measured and observed by an oscilloscope in the polarization-characteristic evaluating apparatus, those pulses and voltages being used in evaluating the polarization characteristic of a ferroelectric capacitor by the polarization-characteristic evaluating apparatus of the second embodiment. In those figures, (a) and (d) are the waveforms of voltage pulses generated by the first and second pulse generators 102 and 103, and the pulse generator 121; (b) and (e) are the waveforms of voltages that appear at the first input terminal 122a of the oscilloscope 122 and are measured by the oscilloscope; and (c) and (f) are the waveforms of voltages that appear at the fourth input terminal 122d of the oscilloscope 122 and are measured by the oscilloscope.

Also in those figures, numeral 181 is a voltage pulse generated by the second pulse generator 103; 182 is a voltage pulse generated by the first pulse generator 102; 183 is a voltage pulse generated by the pulse generator 121; 184 and 185 are voltages that are applied to the first input terminal 122a of the oscilloscope 122 and measured by the oscilloscope; 186 and 187 are voltages that are applied to the fourth input terminal 122d of the oscilloscope 122 and measured by the oscilloscope; 188 and 189 are voltage pulses generated by the first pulse generator 102; 190 and 191 are voltages that are applied to the first input terminal 122a of the oscilloscope 122 and measured by the oscilloscope; 192 and 193 are voltages that are applied to the fourth input terminal 122d of the oscilloscope 122 and measured by the oscilloscope; 194 is a voltage pulse generated by the first pulse generator 102; 195 is a voltage pulse generated by the second pulse generator 103; 196 and 197 are voltages that are applied to the first input terminal 122a of the oscilloscope 122 and measured by the oscilloscope; and 198 and 199 are voltages that are applied to the fourth input terminal 122d of the oscilloscope 122 and measured by the oscilloscope. Further, t5 is a time point where the voltage 184 starts to vary; t6 is a time point where the voltage 185 starts to vary; t7 is a time point where the voltage 190 starts to vary; t8 is a time point where the voltage 119 starts to vary; t9 is a time point where the voltage 196 starts to vary; and t10 is a time point where the voltage 197 starts to vary.

Figure 19:
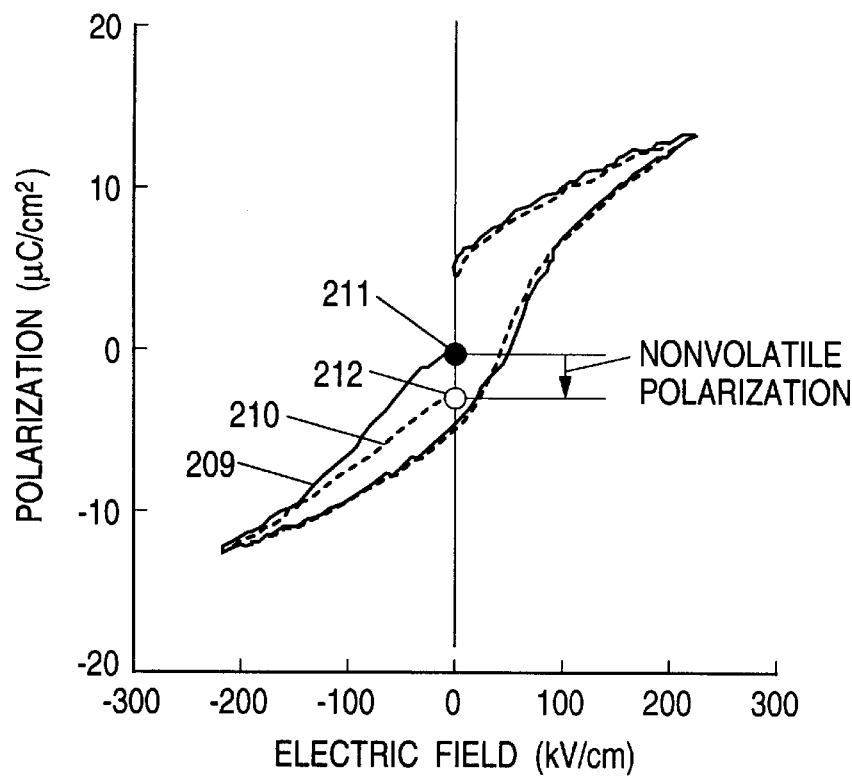
FIG. 19 is a graph showing still another polarization characteristic of the ferroelectric capacitor, measured by the polarization-characteristic evaluating apparatus of the second embodiment.

FIGS. 17 to 19 are graphs showing polarization characteristics of the ferroelectric capacitor, measured by the polarization-characteristic evaluating apparatus of the second embodiment. In FIG. 17, 201 and 202 are polarization hysteresis curves; 203 is a polarization of the ferroelectric capacitor at time point t5; and 204 is a polarization of the ferroelectric capacitor at time point t6. In FIG. 18, 205 and 206 are polarization hysteresis curves; 207 is a polarization of the ferroelectric capacitor at time point t7; and 208 is a polarization of the ferroelectric capacitor at time point t8. In FIG. 19, 209 and 210 are polarization hysteresis curves; 211 is a polarization of the ferroelectric capacitor at time point t9; and 212 is a polarization of the ferroelectric capacitor at time point t10.

Figure 20:
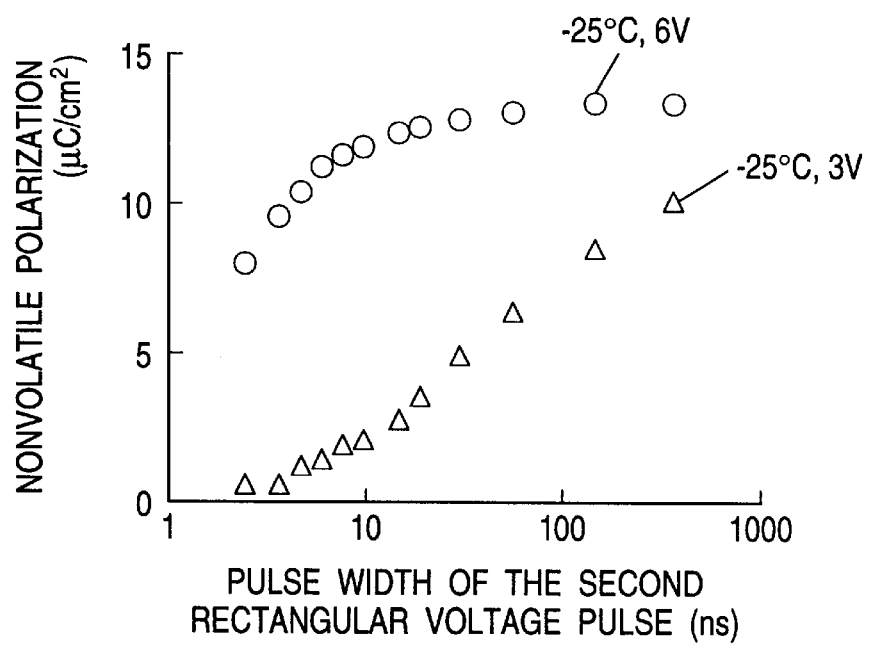
FIG. 20 is a graph depicting the pulse-width dependency and the pulse-voltage dependency of the nonvolatile polarization, measured by the polarization-characteristic evaluating apparatus of the second embodiment.
Figure 21:
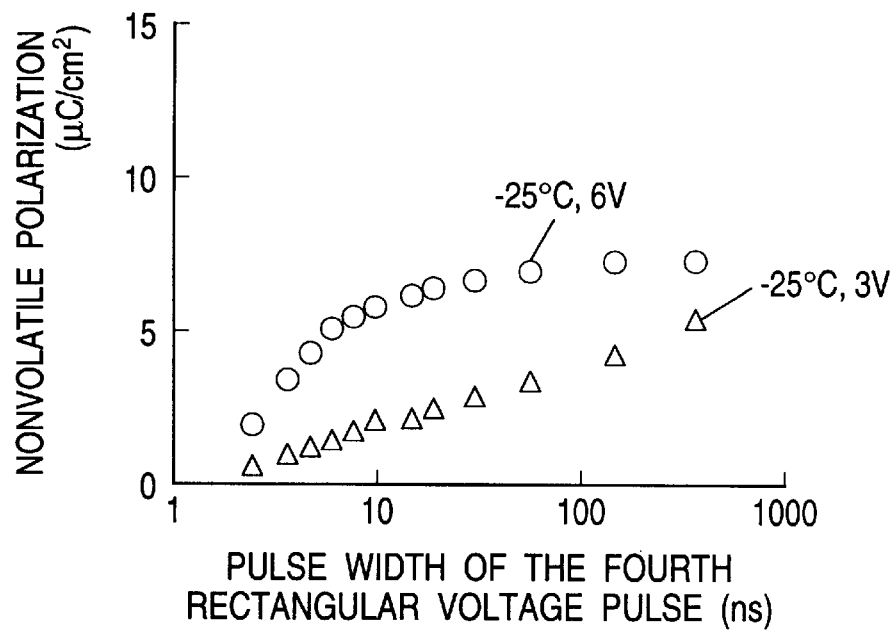
FIG. 21 is another graph depicting the pulse-width dependency and the pulse-voltage dependency of the nonvolatile polarization, measured by the polarization-characteristic evaluating apparatus of the second embodiment.
Figure 22:
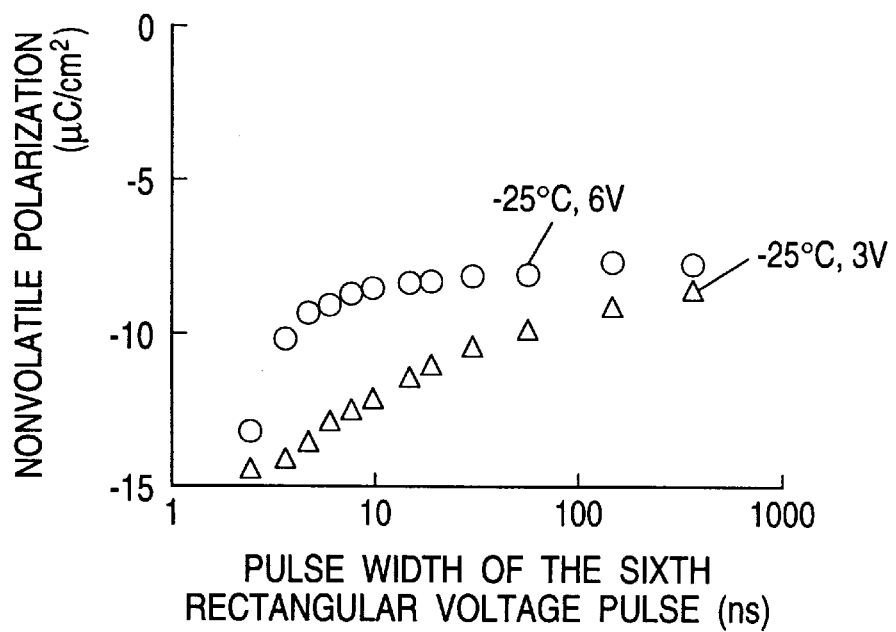
FIG. 22 is still another graph depicting the pulse-width dependency and the pulse-voltage dependency of the nonvolatile polarization, measured by the polarization-characteristic evaluating apparatus of the second embodiment.

FIGS. 20 to 22 are graphs showing the pulse-width dependency and the pulse-voltage dependency of the nonvolatile polarization, measured by the polarization-characteristic evaluating apparatus of the second embodiment.

A flow of evaluating the polarization characteristic of a ferroelectric capacitor will be described hereunder.

[Step Pb1]

A first rectangular voltage pulse 181 that is generated by the second pulse generator 103 is applied to the ferroelectric capacitor 100. By the application of the first voltage pulse, a polarization state is set to a predetermined polarization state. The switches 107 and 108 are in an off state.

[Step Pb2]

The switches 107 and 108 are turned on.

[Step Pb3]

A trapezoidal voltage pulse 183 that is generated by the pulse generator 121 is applied to the ferroelectric capacitor 100. The voltage 184, which appears at the first input terminal 122a of the oscilloscope 122, is measured by the oscilloscope. Further, the voltage 186, which appears at the fourth input terminal 122d of the oscilloscope 122, is measured by the oscilloscope.

[Step Pb4]

The switches 107 and 108 are turned off.

[Step Pb5]

In this step to depict a first polarization hysteresis curve, the following items of task are carried out:

1) to calculate a variation of an electric field applied to the ferroelectric capacitor 100 with respect to time by using the thickness of a thin film of the ferroelectric capacitor 100 and the voltage 184;

2) to calculate a variation of an amount of charge at the second electrode 100b of the ferroelectric capacitor 100 (when the voltage pulse 153 is applied thereto) with respect to time by using a capacitance of the reference capacitor 101 and the waveform of the voltage 186;

3) to obtain a relationship between the electric field applied to the ferroelectric capacitor 100 and the amount of charge at the second electrode 100b of the ferroelectric capacitor 100; and 4) to depict a first polarization hysteresis curve 201 (in this case, a value halfway between the maximum and minimum values of the charge amount is set at a zero point of polarization quantity).

[Step Pb6]

The first rectangular voltage pulse 181 that is generated by the second pulse generator 103 is applied to the ferroelectric capacitor 100. By the application of the first voltage pulse, a polarization state is set to a predetermined polarization state.

[Step Pb7]

A second rectangular voltage pulse 182 that is generated by the first pulse generator 102 is applied to the ferroelectric capacitor 100. In this state, a polarization state of the ferroelectric capacitor 100 varies depending on the pulse width and the amplitude of the second voltage pulse 182.

[Step Pb8]

The switches 107 and 108 are turned on.

[Step Pb9]

A trapezoidal-wave voltage pulse 183 that is generated by the pulse generator 121 is applied to the ferroelectric capacitor 100. A voltage 185 is applied to the first input terminal 122a of the oscilloscope 122, and a voltage 187 is applied to the fourth input terminal 122d of the oscilloscope 122. Those voltages are measured by the oscilloscope 122.

[Step Pb10]

The switches 107 and 108 are turned off.

[Step Pb11]

This step is for depicting a second polarization hysteresis curve, and to this end, the following items of task are carried out:

1) to calculate a variation of an electric field applied to the ferroelectric capacitor 100 with respect to time by using the thickness of a thin film of the ferroelectric capacitor 100 and the voltage 185;

2) to calculate a variation of an amount of charge at the second electrode 100b of the ferroelectric capacitor 100 (when the voltage pulse 183 is applied thereto) with respect to time by using a capacitance of the reference capacitor 101 and the waveform of the voltage 187;

3) to obtain a relationship between the electric field applied to the ferroelectric capacitor 100 and the amount of charge at the second electrode 100b of the ferroelectric capacitor 100; and 4) to depict a second polarization hysteresis curve 202 on the basis of the obtained relationship (in this case, a value halfway between the maximum and minimum values of the charge amount is set at a zero point of polarization quantity).

[Step Pb12]

A difference between the quantities of the polarization 204 and 205 is calculated to obtain a nonvolatile polarization.

Following the step Pb12, the pulse width of the second voltage pulse 182 is altered, and the sequence of steps Pb6 to Pb12 is repeated. The sequence of steps Pb1 to Pb12 is exactly the same as of steps Pa1 to Pa12 in the first embodiment.

[Step Pb13]

A first rectangular voltage pulse 181 that is generated by the second pulse generator 103 is applied to across the ferroelectric capacitor 100. With the application of the voltage application, a polarization state of the ferroelectric capacitor is set to a predetermined polarization state.

[Step Pb14]

A third rectangular voltage pulse 188 that is generated by the first pulse generator 102 is applied to across the ferroelectric capacitor 100. With the voltage application, a polarization state in the ferroelectric capacitor is set to a zero or thereabouts (of the polarization quantity).

[Step Pb15]

The switches 107 and 108 are turned on.

[Step Pb16]

A trapezoidal voltage pulse 183 derived from the pulse generator 121 is applied to the ferroelectric capacitor 100; a voltage 190 that appears at the first input terminal 122a of the oscilloscope 122 is measured and viewed by the oscilloscope; and a voltage 192 that appears at the fourth input terminal 122d of the oscilloscope 122 is measured and viewed by the oscilloscope.

[Step Pb17]

The switches 107 and 108 are turned off.

[Step Pb18]

This step is for depicting a third polarization hysteresis curve, and to this end the following items of task are carried out:

1) to calculate a variation of an electric field applied to the ferroelectric capacitor 100 with respect to time by using the thickness of a thin film of the ferroelectric capacitor 100 and the voltage 190;

2) to calculate a variation of an amount of charge at the second electrode 100b of the ferroelectric capacitor 100 (when the voltage pulse 183 is applied thereto) with respect to time by using a capacitance of the reference capacitor 101 and the voltage 192;

3) to obtain a relationship between the electric field applied to the ferroelectric capacitor 100 and the amount of charge at the second electrode 100b of the ferroelectric capacitor 100; and 4) to depict a third polarization hysteresis curve 205 on the basis of the obtained relationship (in this case, a value halfway between the maximum and minimum values of the charge amount is set at a zero point of polarization quantity).

[Step P19]

A first rectangular voltage pulse 181 that is generated by the second pulse generator 103 is applied to the ferroelectric capacitor 100, to thereby set a polarization state of the ferroelectric capacitor 100 to a predetermined polarization state.

[Step Pb20]

A third rectangular voltage pulse 188 that is also generated by the first pulse generator 102 is applied to the ferroelectric capacitor 100, to thereby set a polarization state of the ferroelectric capacitor to zero or thereabouts of polarization quantity.

[Step Pb21]

A fourth rectangular voltage pulse 189 that is generated by the first pulse generator 102 is applied to the ferroelectric capacitor 100. In this state, a polarization state of the ferroelectric capacitor 100 varies depending on the pulse width and the pulse voltage of the fourth rectangular voltage pulse 189.

[Step Pb22]

The switches 107 and 108 are turned on.

[Step Pb23]

A trapezoidal voltage pulse 183 that is generated by the pulse generator 121 generating a pulse of an undetermined waveform is applied to the ferroelectric capacitor 100; a voltage 191, which appears at the first input terminal 122a of the oscilloscope 122, is measured by the oscilloscope; and a voltage 193, which appears at the fourth input terminal 122d of the oscilloscope 122, is measured by the oscilloscope.

[Step Pb24]

The switches 107 and 108 are turned off.

[Step Pb25]

In this step, to depict a fourth-polarization hysteresis curve, the following items of task are carried out:

1) to calculate a variation of an electric field applied to the ferroelectric capacitor 100 with respect to time by using the thickness of a thin film of the ferroelectric capacitor 100 and the voltage 191;

2) to calculate a variation of an amount of charge at the second electrode 100b of the ferroelectric capacitor 100 (when the voltage pulse 183 is applied thereto) with respect to time by using a capacitance of the reference capacitor 101 and the voltage 193;

3) to obtain a relationship between the electric field applied to the ferroelectric capacitor 100 and the amount of charge at the second electrode 100b of the ferroelectric capacitor 100; and 4) to depict a fourth polarization hysteresis curve 206 on the basis of the obtained relationship (in this case, a value halfway between the maximum and minimum values of the charge amount is set at a zero point of polarization quantity).

[Step Pb26]

A difference between the quantities of the polarization 208 and 207 is calculated to obtain a nonvolatile polarization. Following the step Pb26, the pulse width of the second voltage pulse 189 is altered, and the sequence of steps Pb19 to Pb26 is repeated.

[Step Pb27]

A first rectangular voltage pulse 181 that is generated by the second pulse generator 103 is applied to across the ferroelectric capacitor 100. With the application of the voltage application, a polarization state of the ferroelectric capacitor is set to a predetermined polarization state.

[Step Pb28]

A fifth rectangular voltage pulse 194 that is generated by the first pulse generator 102 is applied to across the ferroelectric capacitor 100. With the voltage application, a polarization state in the ferroelectric capacitor is set to a zero or thereabouts (of the polarization quantity).

[Step Pb29]

The switches 107 and 108 are turned on.

[Step Pb30]

A trapezoidal voltage pulse 183 derived from the pulse generator 121 is applied to the ferroelectric capacitor 100; a voltage 196 that appears at the first input terminal 122a of the oscilloscope 122 is measured and viewed by the oscilloscope; and a voltage 198 that appears at the fourth input terminal 122d of the oscilloscope 122 is measured and viewed by the oscilloscope.

[Step Pb31]

The switches 107 and 108 are turned off.

[Step Pb32]

This step is for depicting a fifth polarization hysteresis curve, and to this end the following items of task are carried out:

1) to calculate a variation of an electric field applied to the ferroelectric capacitor 100 with respect to time by using the thickness of a thin film of the ferroelectric capacitor 100 and the voltage 196;

2) to calculate a variation of an amount of charge at the second electrode 100b of the ferroelectric capacitor 100 (when the voltage pulse 183 is applied thereto) with respect to time by using a capacitance of the reference capacitor 101 and the voltage 198;

3) to obtain a relationship between the electric field applied to the ferroelectric capacitor 100 and the amount of charge at the second electrode 100b of the ferroelectric capacitor 100; and 4) to depict a fifth polarization hysteresis curve 209 on the basis of the obtained relationship (in this case, a value halfway between the maximum and minimum values of the charge amount is set at a zero point of polarization quantity).

[Step Pb33]

A first rectangular voltage pulse 181 that is generated by the second pulse generator 103 is applied to across the ferroelectric capacitor 100. With the application of the voltage application, a polarization state of the ferroelectric capacitor is set to a predetermined polarization state.

[Step Pb34]

A fifth rectangular voltage pulse 194 that is generated by the first pulse generator 102 is applied to across the ferroelectric capacitor 100. With the voltage application, a polarization state in the ferroelectric capacitor is set to a zero or thereabouts (of the polarization quantity).

[Step Pb35]

A sixth rectangular voltage pulse 195 that is generated by the first pulse generator 102 is applied to across the ferroelectric capacitor 100. In this state, a polarization state in the ferroelectric capacitor 100 varies depending on the pulse width and the pulse voltage of the sixth rectangular voltage pulse 195.

[Step Pb36]

The switches 107 and 108 are turned on.

[Step Pb37]

A trapezoidal voltage pulse 183 derived from the pulse generator 121 is applied to the ferroelectric capacitor 100; a voltage 197 that appears at the first input terminal 122a of the oscilloscope 122 is measured and viewed by the oscilloscope; and a voltage 199 that appears at the fourth input terminal 122d of the oscilloscope 122 is measured and viewed by the oscilloscope.

[Step Pb38]

The switches 107 and 108 are turned off.

[Step Pb39]

This step is for depicting a sixth polarization hysteresis curve, and to this end the following items of task are carried out:

1) to calculate a variation of an electric field applied to the ferroelectric capacitor 100 with respect to time by using the thickness of a thin film of the ferroelectric capacitor 100 and the voltage 197;
2) to calculate a variation of an amount of charge at the second electrode 100b of the ferroelectric capacitor 100 (when the voltage pulse 183 is applied thereto) with respect to time by using a capacitance of the reference capacitor 101 and the voltage 199;
3) to obtain a relationship between the electric field applied to the ferroelectric capacitor 100 and the amount of charge at the second electrode 100b of the ferroelectric capacitor 100; and
4) to depict a fifth polarization hysteresis curve 210 on the basis of the obtained relationship (in this case, a value halfway between the maximum and minimum values of the charge amount is set at a zero point of polarization quantity).

[Step Pb40]

A difference between the quantities of the polarization 212 and 211 is calculated to obtain a nonvolatile polarization. Following the step Pb40, the pulse width of the second voltage pulse 195 is altered, and the sequence of steps Pb33 to Pb40 is repeated.

It is noted that the first and second pulse generators 102 and 103, the ferroelectric capacitor 100 to be measured, reference capacitor 101, and the wires 110 and 111 are integrated into the semiconductor substrate 99 in the polarization-characteristic evaluating apparatus of FIG. 1. Therefore, the wires are short, and the capacitance formed around those wires is small. The arrangement and structure of the polarization-characteristic evaluating apparatus of the embodiment allows a voltage pulse of 100 ns or shorter in pulse width (generated by the first or second pulse generator 102 or 103 (FIG. 4)) to be applied to the ferroelectric capacitor. The pulse width dependency and the pulse voltage dependency of the nonvolatile polarization (FIG. 20) can be evaluated which is essential to the analyzing of the operations of the FeRAM. To evaluate those factors, the nonvolatile polarization is measured by varying the pulse width and the pulse voltage of the second rectangular voltage pulse 182. The pulse width dependency and the pulse voltage dependency of the nonvolatile polarization (FIGS. 21 and 22) can be evaluated which is essential to the high level analysis of the operations of the FeRAM being in a desired written state. To evaluate those factors, a nonvolatile polarization is measured in a manner that: 1) a polarization state of the ferroelectric capacitor is varied by applying the third and fifth rectangular voltage pulses 188 and 194 to the ferroelectric capacitor, while corresponding to different written states of the FeRAM, and 2) the pulse width and the pulse voltage of the fourth and sixth rectangular voltage pulses 189 and 195 are varied.

As described above, in the structure of the polarization-characteristic evaluating apparatus of the second embodiment, the pulse generators and the ferroelectric capacitor are formed on and in the same semiconductor substrate. Therefore, the parasitic capacitance around the wires connecting those components is reduced. A voltage pulse of 100 ns or shorter may be used as the voltage pulse to be applied to the ferroelectric capacitor.

The ferroelectric capacitor is always in a medium polarization state between a polarization state where the polarization directions are aligned in a unidirection and a polarization state where the polarization quantity is zero. Evaluation of the pulse width dependency and the pulse voltage dependency of the nonvolatile polarization (FIGS. 20 to 22, steps Pb1 to Pb40) is effective for a high level analysis of the operations of the FeRAM.

The first rectangular voltage pulse 181 (FIGS. 14 to 16) may be replaced with any of triangular, trapezoidal and sine wave voltage pulses. The trapezoidal voltage pulse 183 (FIGS. 14 to 16) may also be replaced with any of triangular, trapezoidal and sine wave voltage pulses.

The trigger generator 600 (FIG. 1) may be omitted. In this case, the first and second pulse generators 102 and 103 are selectively operated at appropriate timings.

A third embodiment of the present invention will be described.

Figure 23:
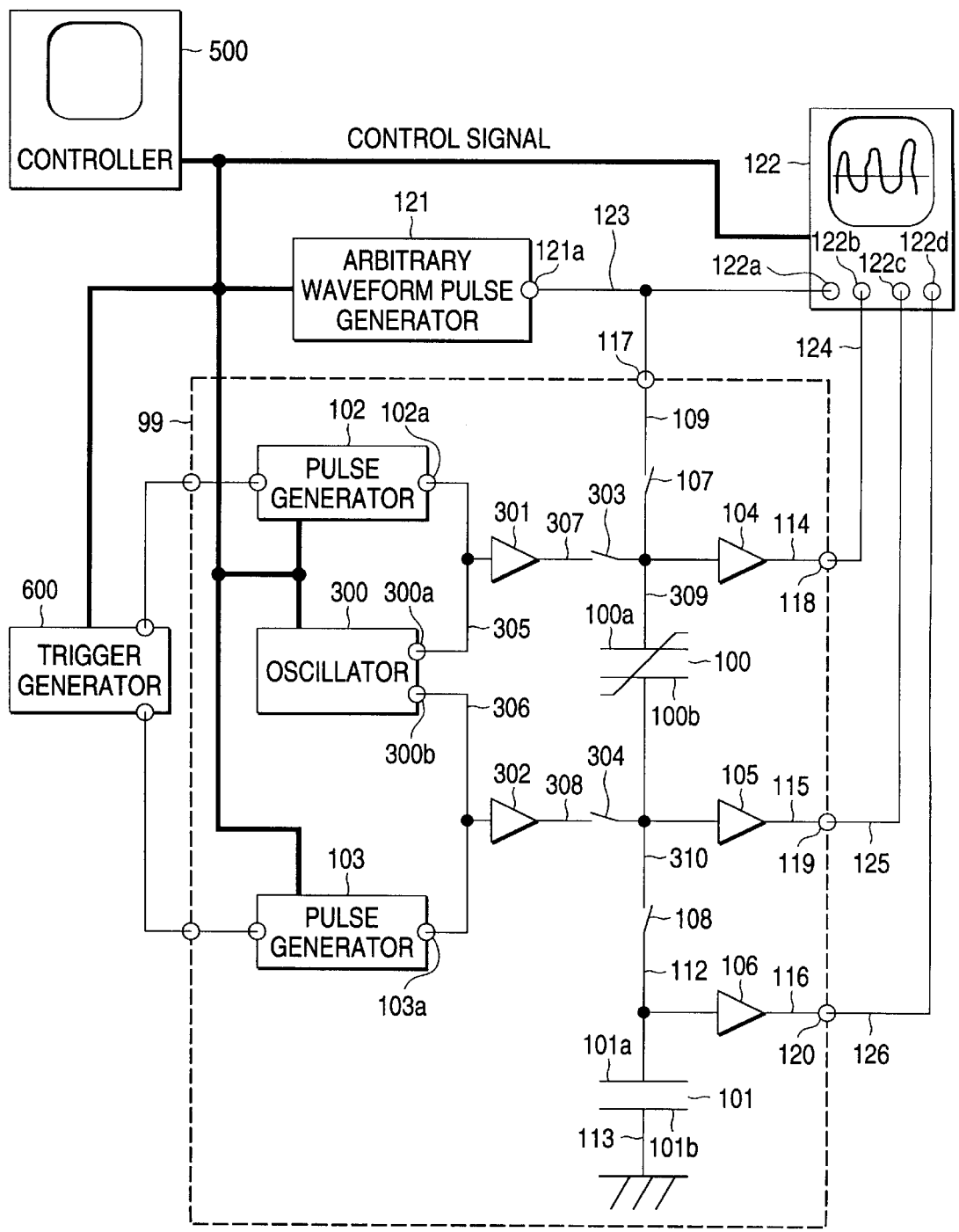
FIG. 23 diagrams an apparatus for evaluating the polarization characteristic of a ferroelectric capacitor, which constitutes a third embodiment of the invention.

FIG. 23 is an apparatus for evaluating the polarization characteristic of a ferroelectric capacitor, which constitutes a third embodiment of the invention. As shown, an oscillator 300 is additionally formed on and in the semiconductor substrate 99 when comparing the FIG. 1 arrangement in the first embodiment. The first and second output terminal 300a and 300b of the oscillator 300 are respectively connected to the first and second electrodes 100a and 100b of the ferroelectric capacitor 100. The signals output from those output terminals 300a and 300b of the oscillator 300 are opposite to each other in polarity, viz., the output signal at the second output terminal 300b corresponds to the inverted output signal at the first output terminal 300a. The pulses output from the first and second pulse generators 102 and 103 are applied to the ferroelectric capacitor 100 by way of buffers 301 and 302, respectively. With such a circuit arrangement, the waveform of the pulse used for evaluating the nonvolatile polarization of the ferroelectric capacitor is substantially the same as of the pulse used for evaluating the polarization characteristic deterioration of the ferroelectric capacitor that is caused when the ferroelectric capacitor is placed in an alternate electric field by the AC voltage pulses applied thereto. The remaining portion of the apparatus arrangement and structure is the same as of the FIG. 1 arrangement, and therefore like reference numerals are used for designating like portions. In the figure, reference numeral 99 is a semiconductor substrate; 100 is a ferroelectric capacitor to be measured; 101 is a reference capacitor whose capacitance is known; 102 is a first pulse generator; 103 is a second pulse generator; 104 and 105 are buffers; 106 is an impedance converter; 107 and 108 are electrical switches; 109 to 116 are wires; and 117 to 120 are pads. Further, numeral 100a is the first electrode of the ferroelectric capacitor 100; 100b is the second electrode of the same; 101a is the first electrode of the reference capacitor 101; 101b is the second electrode of the same; 102a is the output terminal of the first pulse generator 102; and 103a is the output terminal of the second pulse generator 103. The ferroelectric capacitor 100, reference capacitor 101, first pulse generator 102, second pulse generator 103, buffers 104 to 105, impedance converter 106, electrical switches 107 and 108, wires 109 to 116, and pads 117 to 120 are all formed on and in the semiconductor substrate 99. A capacitance value of the reference capacitor 101 is known. Numeral 121 is a pulse generator for generating a pulse signal of a proper waveform; 122 is an oscilloscope; and 123 to 126 are cables. Numeral 121a is an output terminal of the pulse generator 121; 122a to 122d are first to fourth input terminals of the oscilloscope 122. Also in FIG. 23, numeral 300 is the oscillator; 301 and 302 are buffers; 303 and 304 are electrical switches; and 305 to 310 are wires. The oscillator 300, buffers 301 and 302, switches 303 and 304, and wires 305 and 310 are all formed on and in the semiconductor substrate 99. Further, 300a and 300b are the first and second output terminals of the oscillator 300.

Figure 24:
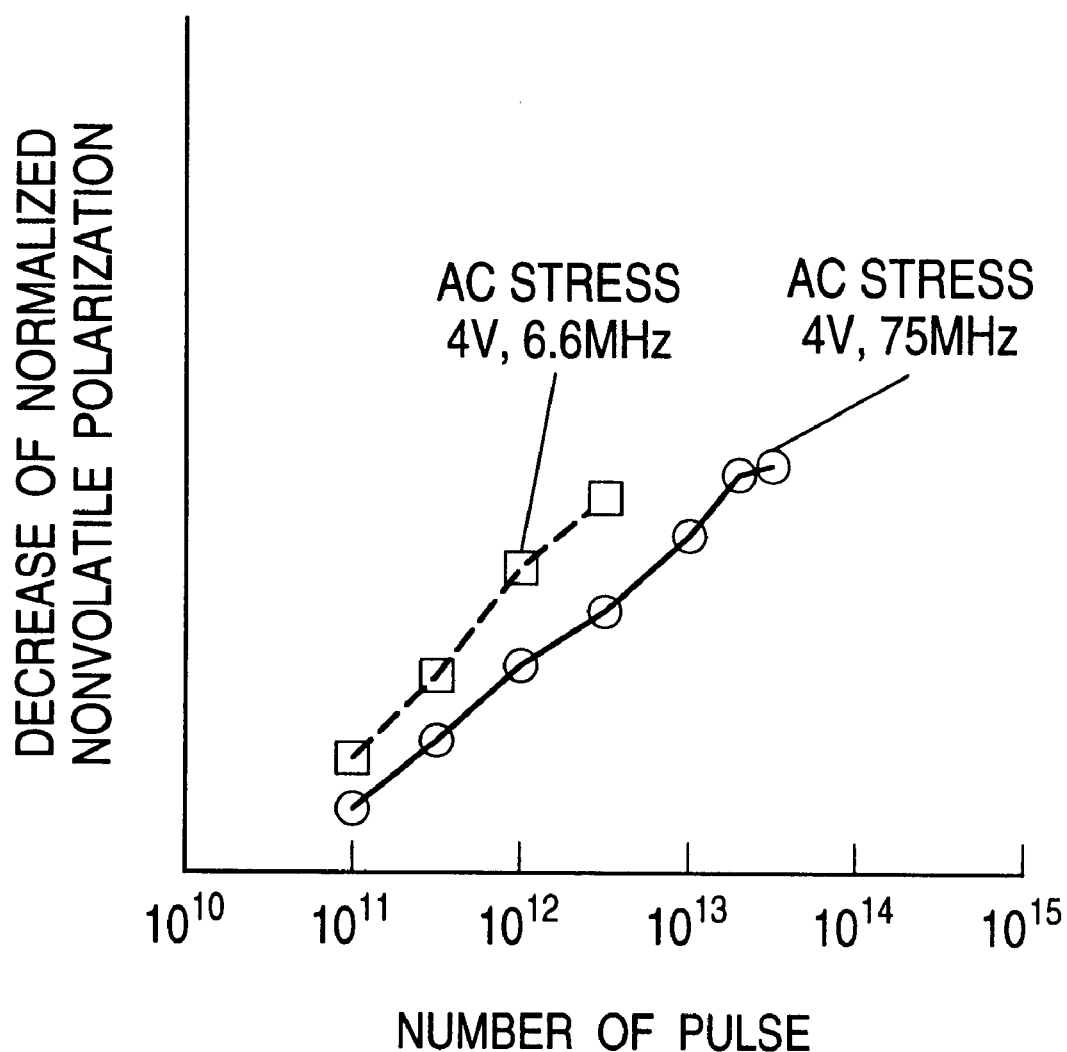
FIG. 24 is a graph showing a nonvolatile polarization deterioration (normalized) owing to the stressing by AC voltage pulses, evaluated by the polarization-characteristic evaluating apparatus of the third embodiment.

In the FIG. 23 evaluating apparatus, the wires 305 to 310 are integrated onto the semiconductor substrate 99. Therefore, the parasitic capacitance associated therewith is small. The result is to enable a reliability simulation test for inspecting the nonvolatile polarization deterioration of the ferroelectric capacitor that is caused when the ferroelectric capacitor is placed in an alternate electric field by the AC voltage pulse of 100 ns or shorter (pulse width) applied thereto (FIG. 24). The first and second pulse generators 102 and 103, oscillator 300, and buffers 301 and 302 are fabricated into the semiconductor substrate 99, and the pulses that are generated by the generators 102 and 103, and the pulses that are generated by the oscillator 300 are applied to the ferroelectric capacitor 100 by way of the buffers 301 and 302. Therefore, the waveform of the pulse used for evaluating the nonvolatile polarization of the ferroelectric capacitor is substantially the same as of the pulse used for evaluating the polarization characteristic deterioration of the ferroelectric capacitor that is caused when the ferroelectric capacitor is placed in an alternate electric field by the AC voltage pulses applied thereto. And an exact simulation test for inspecting the nonvolatile polarization deterioration is ensured.

A fourth embodiment of the present invention will be described.

Figure 25:
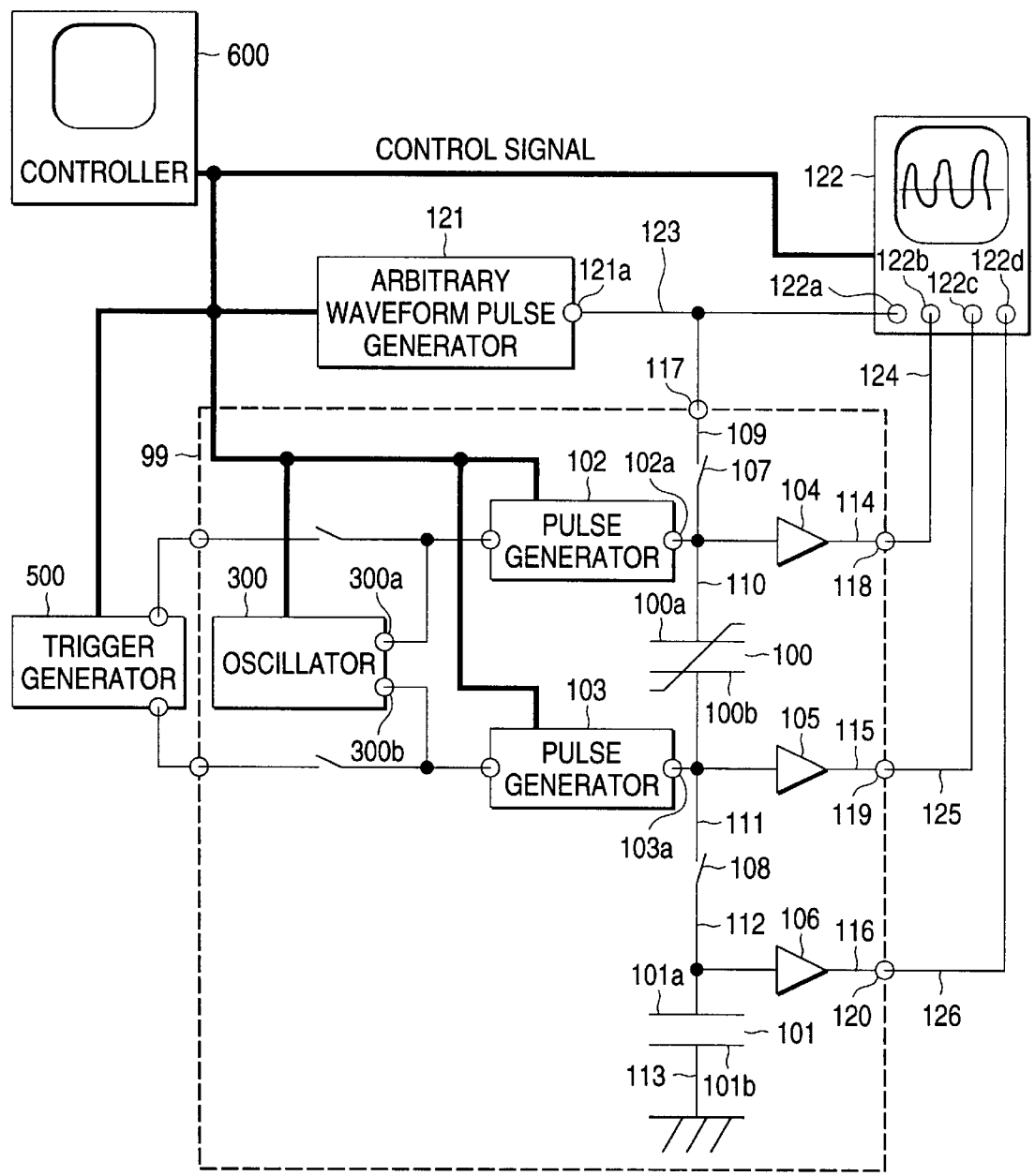
FIG. 25 diagrams an apparatus for evaluating the polarization characteristic of a ferroelectric capacitor, which constitutes a fourth embodiment of the invention.

FIG. 25 is an apparatus for evaluating the polarization characteristic of a ferroelectric capacitor, which constitutes a fourth embodiment of the invention. In the FIG. 25 circuit connection, the buffers 301 and 302 (FIG. 23) are not used, and the pulses output from the pulse generators are directly applied to the ferroelectric capacitor 100. The output terminals of the trigger generator are respectively coupled to the input terminals of the first and second pulse generators 102 and 103 by way of switches. The output terminals of the oscillator 300 are coupled to the input terminals of the first and pulse generators 102 and 103, respectively. An output signal is applied to the ferroelectric capacitor 100 through the first and pulse generators 102 and 103. In FIG. 23, like reference numerals are used for like portions in the previous embodiment.

With such a circuit connection, the pulse width of the output signal of the oscillator 300 is controlled in the first and pulse generators 102 and 103 so that the waveform of the pulse used for evaluating the nonvolatile polarization of the ferroelectric capacitor is substantially the same as of the pulse used for evaluating the polarization characteristic deterioration of the ferroelectric capacitor while using the AC pulses. Therefore, an exact simulation test for inspecting the nonvolatile polarization deterioration is ensured. In other words, the stressing waveform is the same as the measuring waveform. Therefore, the reliability test and the measurement for evaluating the polarization characteristic may be conducted under the same conditions.

Also in the structure of the fourth embodiment, the pulse generators, oscillator, and reference capacitor are all fabricated into the semiconductor substrate having the ferroelectric capacitor (to be measured) fabricated therein. Further, the wires 305 to 310 are all integrated onto the semiconductor substrate 99. This fact indicates that the parasitic capacitance associated therewith is small. Therefore, this structure enables the reliability simulation test for inspecting the nonvolatile polarization deterioration using the AC voltage pulse of 100 ns or shorter (FIG. 24). The reduction of the parasitic capacitance of the wires accrues to an exact application of the high frequency pulses to the ferroelectric capacitor, providing an accurate measurement of the polarization characteristic of the capacitance.

An additional advantage is to reduce a chip occupying area.

Further, since the oscillators and the ferroelectric capacitor are fabricated into the same semiconductor substrate, those components are always placed in substantially the same temperature condition, and hence is insensitive, in their characteristics, to a variation of ambient temperature. This advantageous feature provides highly accurate measurement and reliability test suffering from less temperature dependency.

A fifth embodiment of the present invention will be described.

Figure 26:
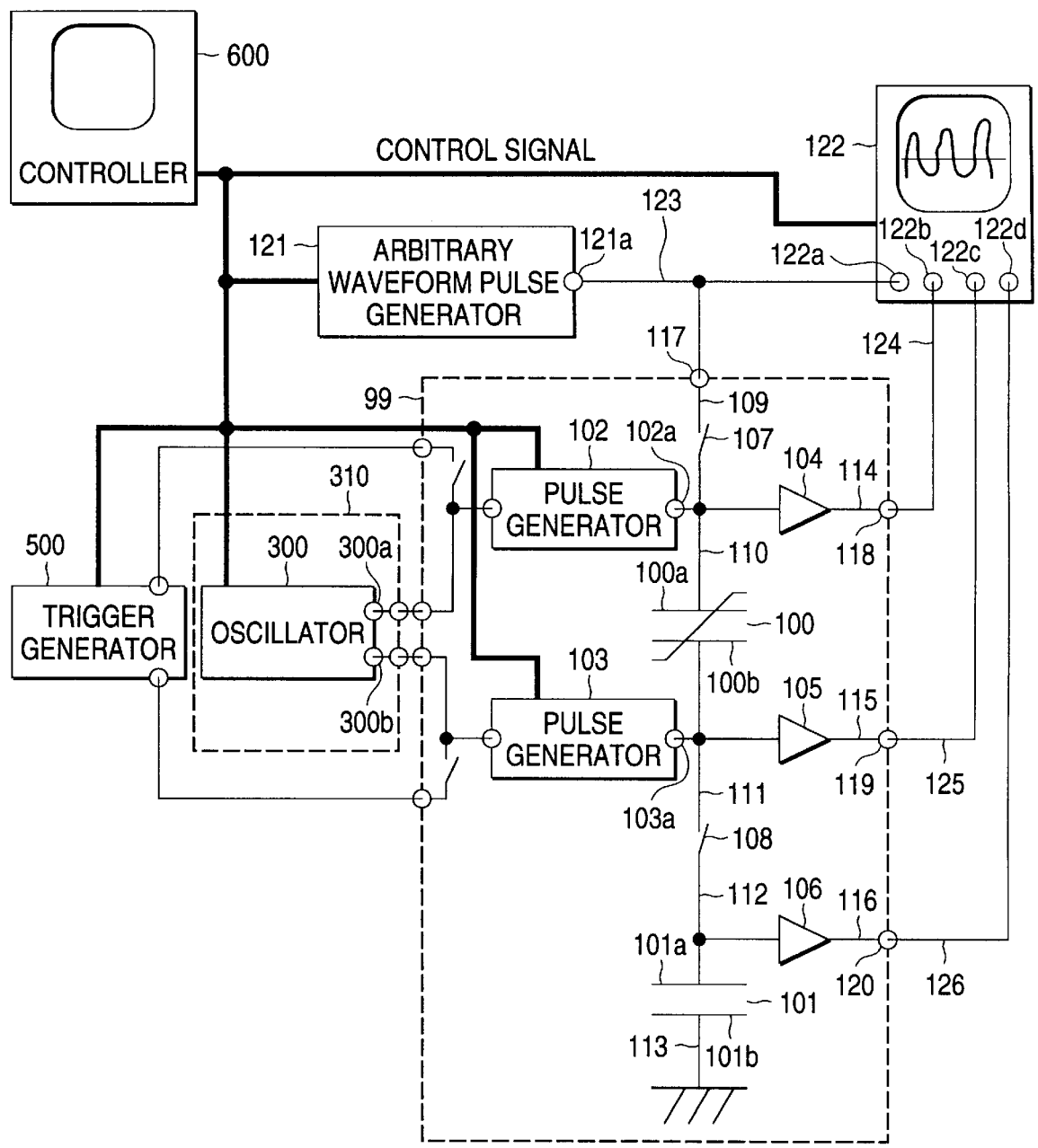
FIG. 26 diagrams an apparatus for evaluating the polarization characteristic of a ferroelectric capacitor, which constitutes a fifth embodiment of the invention.

FIG. 26 is an apparatus for evaluating the polarization characteristic of a ferroelectric capacitor, which constitutes a fifth embodiment of the invention. In the fourth embodiment, the pulse generators, oscillator 300, and buffers are fabricated into the semiconductor substrate 99, as stated above. In the fifth embodiment, the oscillator 300 is fabricated into another semiconductor substrate, whereby forming a called multi-chip circuit. The circuit operations and the evaluating methods are the same as of the fourth embodiment.

Advantages of the fourth embodiment are the advantages of the fourth embodiment, and elimination of adverse effect by the heating of the oscillator and highly accurate measurement accruing from the former. It is desirable that the semiconductor substrate for the oscillator is placed closest to that containing the ferroelectric capacitor, to reduce the wire parasitic capacitance and to secure a good measuring environment.

Figure 27:
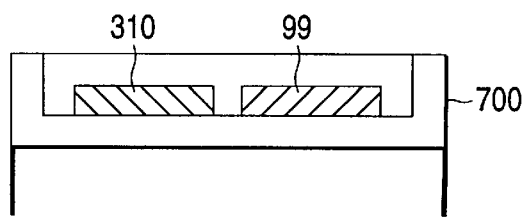
FIG. 27 is a cross sectional view showing the structure of an polarization-characteristic evaluating apparatus which is a sixth embodiment of the invention.

In another (sixth) embodiment of the invention, the semiconductor substrate 99 containing the integrated circuit for measuring the polarization characteristic of the ferroelectric capacitor and the semiconductor substrate 310 containing the oscillator 300 are assembled in one package 700, whereby forming a multi-chip module, as shown in cross sectional form in FIG. 27. In this embodiment, improvement of the measuring accuracy is secured.

Figure 28:
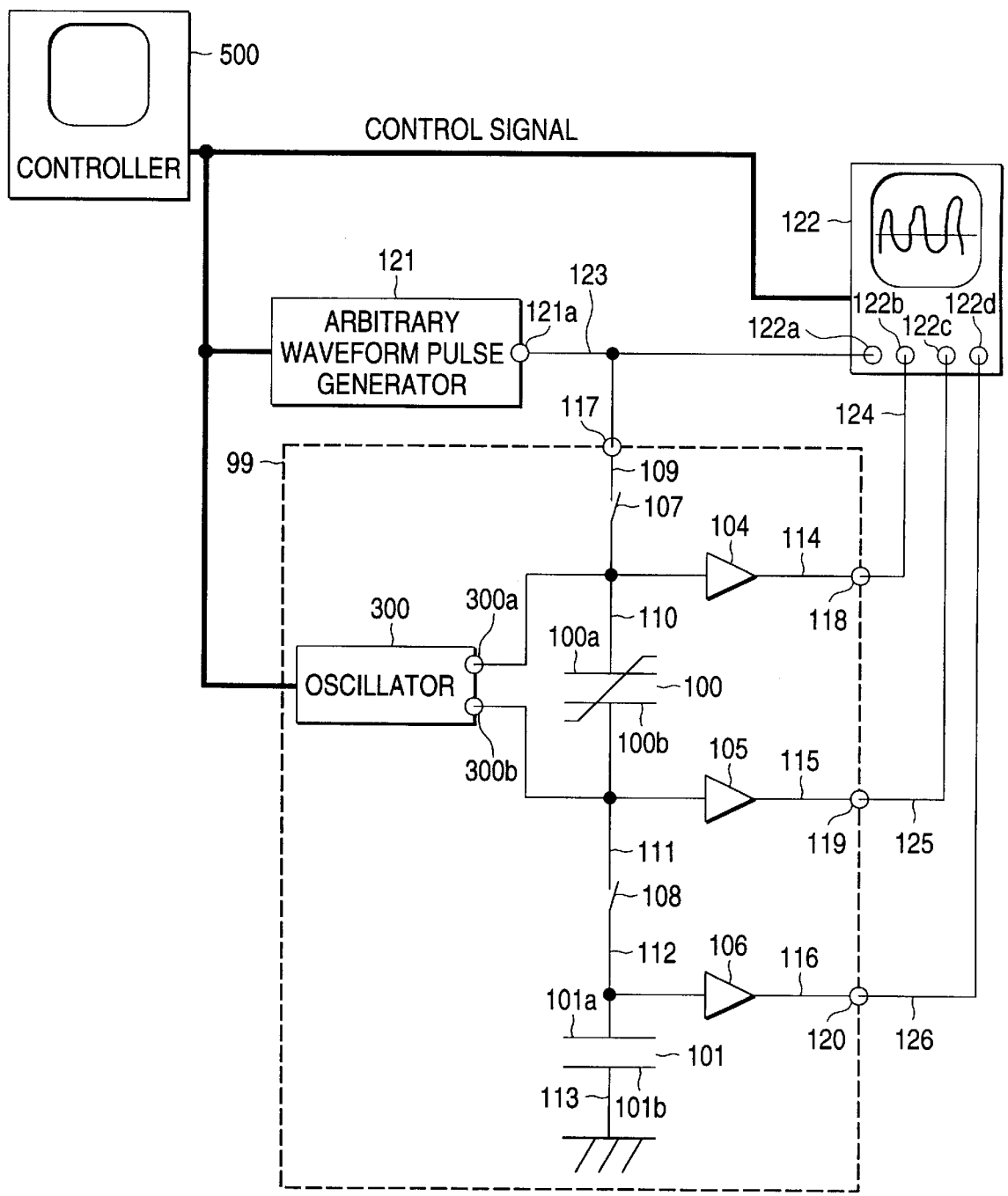
FIG. 28 diagrams an apparatus for evaluating the polarization characteristic of a ferroelectric capacitor, which constitutes a seventh embodiment of the invention.
Figure 29:
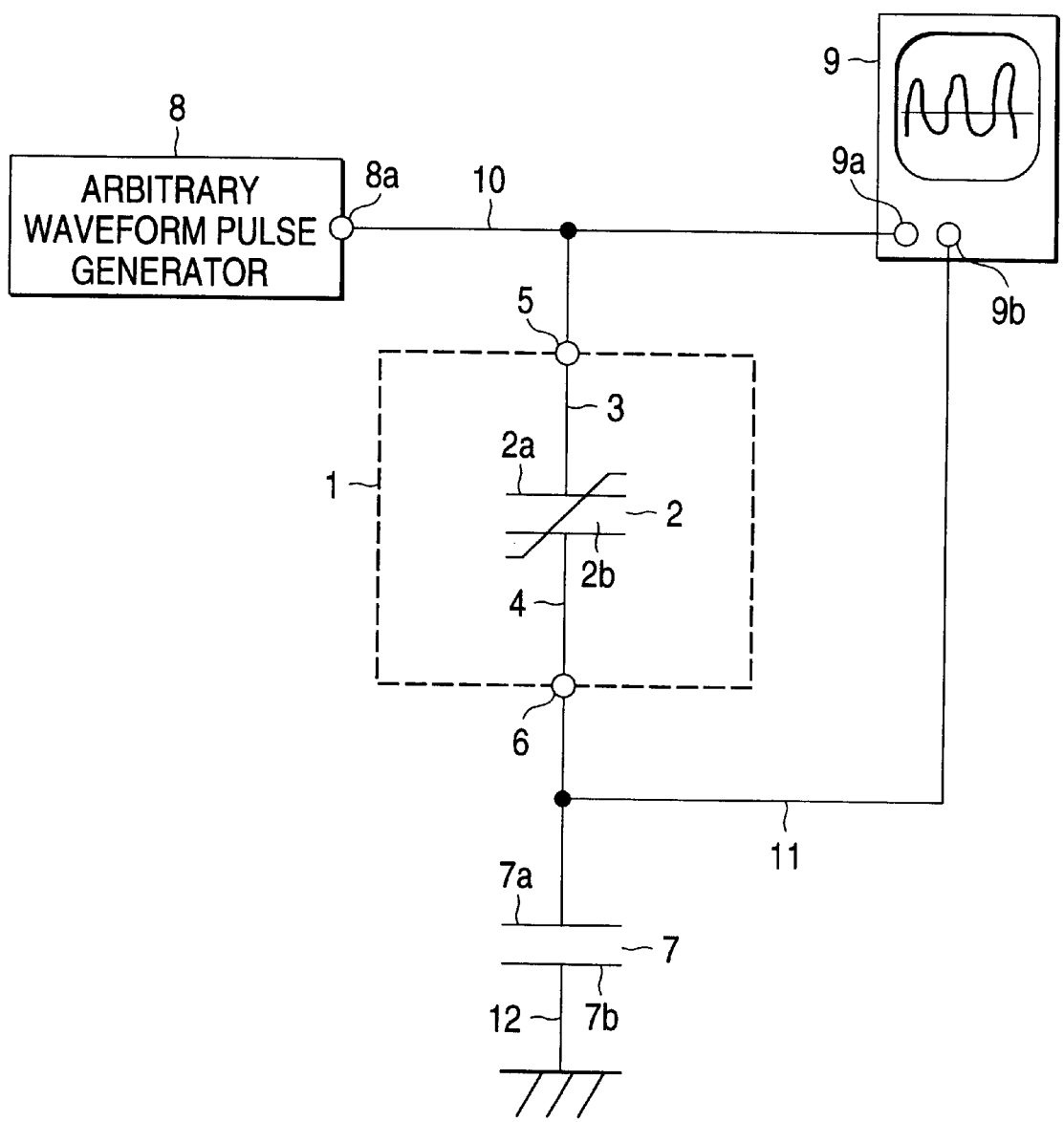
FIG. 29 diagrams a conventional polarization-characteristic evaluating apparatus.
Figure 30:
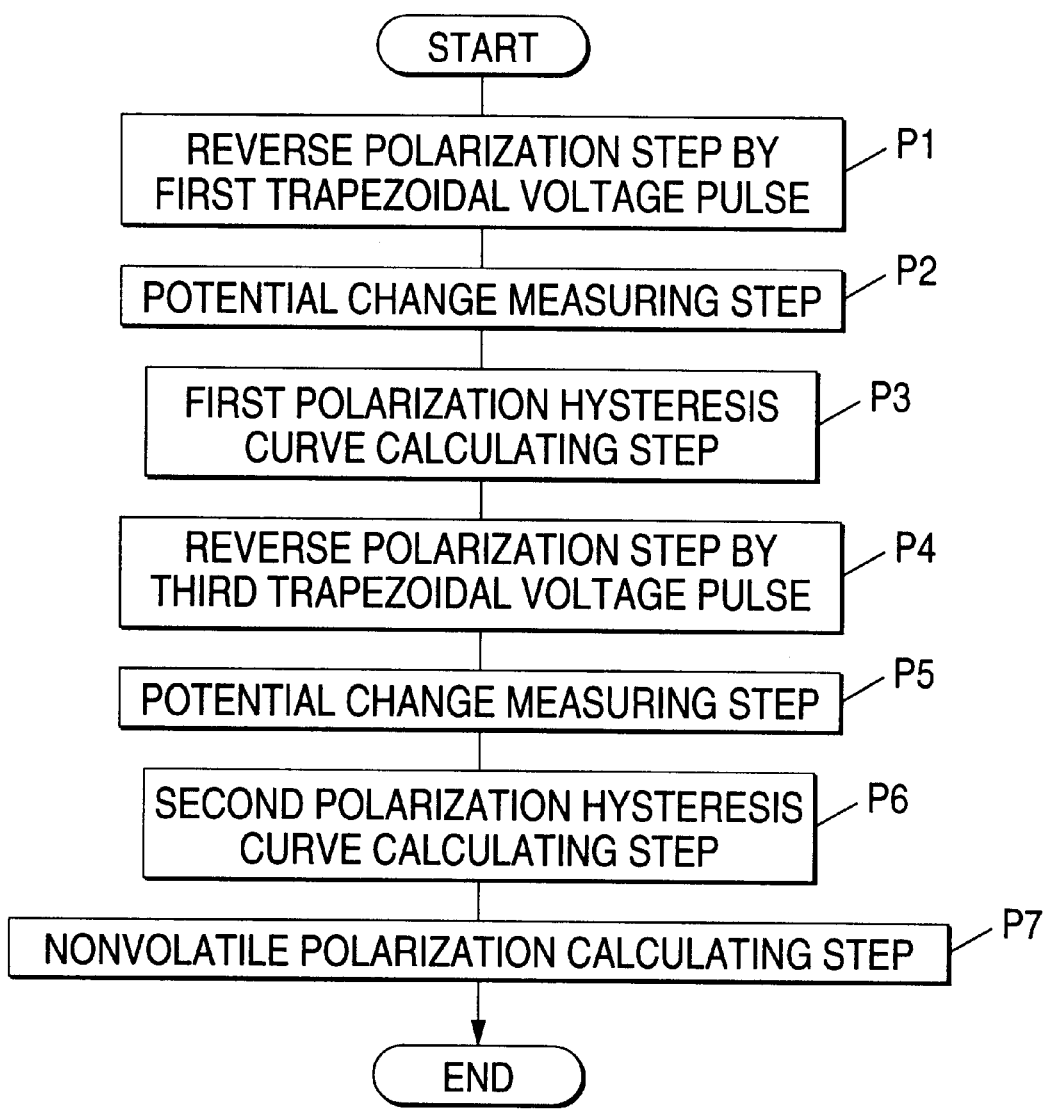
FIG. 30 is a flow chart showing a conventional method of evaluating the polarization characteristic of a ferroelectric capacitor.
Figure 31:
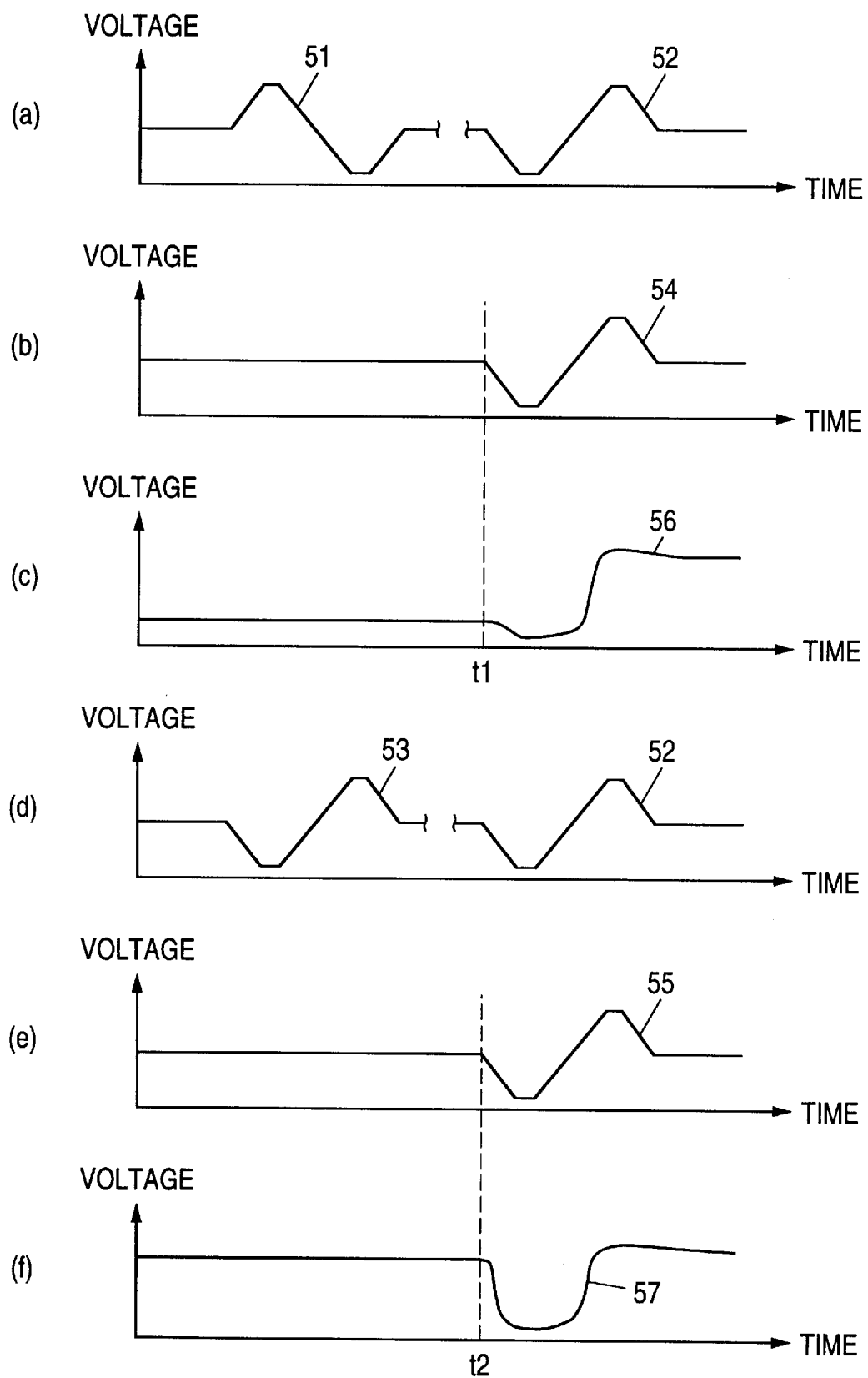
FIG. 31 is a waveform diagram showing the waveforms of voltage pulses applied to a ferroelectric capacitor and voltages observed by an oscilloscope in the FIG. 29 apparatus.
Figure 32:
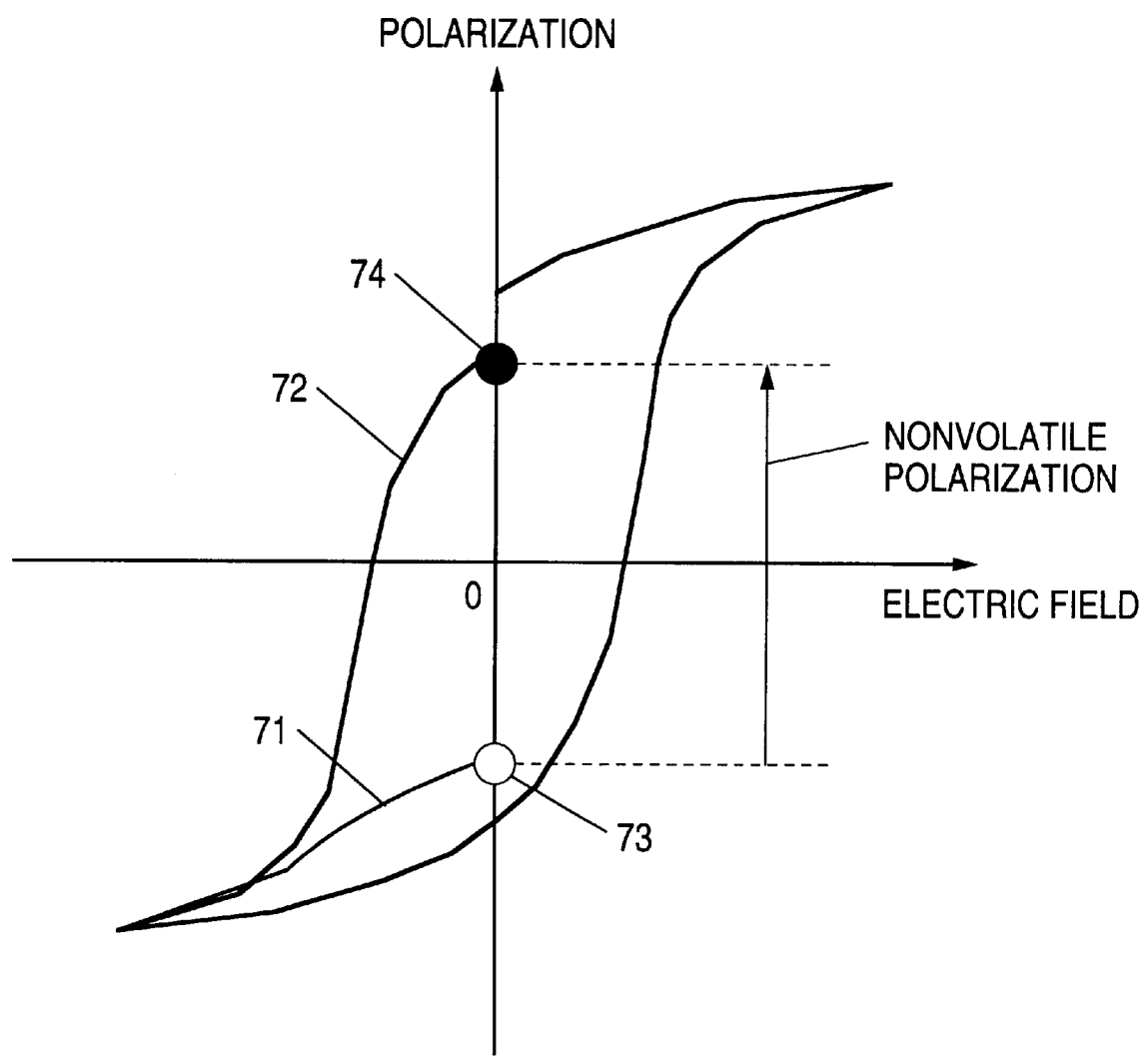
FIG. 32 is a graph showing a polarization characteristic of the ferroelectric capacitor, measured by the FIG. 29 apparatus.

A further (seventh) embodiment of the invention, used only for the reliability test, is illustrated in FIG. 28. As shown, an oscillator 300, a reference capacitor 101, and a ferroelectric capacitor 100 are fabricated into the semiconductor substrate 99 for the integrated circuit for polarization characteristic measurement. That is, the first and pulse generators 102 and 103 are not formed on and in the semiconductor substrate 99, and the trigger generator is not used. The remaining circuit arrangement and structure of this embodiment are substantially the same as of the fourth embodiment.

In this arrangement, the pulses to be applied to the ferroelectric capacitor are produced from the oscillator 300. In this case, the frequency of an output signal output from the oscillator 300 is controlled by the trigger generator 600 in accordance with the measuring purposes.

As seen from the foregoing description, the pulse generators and the ferroelectric capacitor are fabricated into the same semiconductor substrate. This accrues to a reduction of the parasitic capacitance associated with the wires interconnecting those circuit components, and hence elimination of ringing of the voltage pulses generated by the pulse generators. Thus, a voltage pulse of 100 ns or shorter in pulse width can be applied to the ferroelectric capacitor with no problem.

The use of a voltage pulse of 100 ns or shorter brings about the following advantages. When the polarization characteristic of the ferroelectric capacitor is evaluated using the pulse of 100 ns or shorter, a variation of the nonvolatile polarization is evaluated using the pulse of 100 ns or shorter. The same pulse may be used for both the stressing pulse and the measuring pulse, whereby the accuracy of the reliability test is improved.

The oscillator and the ferroelectric capacitor are fabricated into the same semiconductor substrate. Therefore, the parasitic capacitance caused by the wires interconnecting those circuit components is small, and the voltage pulse generated by the oscillator is free from ringing. Therefore, the AC pulse based reliability simulation test may be conducted while correctly applying an AC voltage pulse of 100 ns or shorter to the ferroelectric capacitor. Further, the frequency of the output signal of the oscillator is adjustable, and hence a reliability simulation test using AC voltage pulses can be conducted not using the pulse generator. The output terminals of the oscillator and the output terminals of the pulse generators are connected to the ferroelectric capacitor by way of the same buffers. Therefore, the polarization characteristic can be evaluated by utilization of the voltage pulse whose waveform is the same as of the voltage pulse used for the reliability simulation test for the polarization characteristic deterioration. The results of the simulation test are exact.

Further, the polarization-characteristic evaluating method of the invention includes a polarization initializing step. Therefore, the quantity of the polarization reversal in the ferroelectric capacitor when a voltage pulse is applied thereto can be evaluated while being free from the past polarization state.

Furthermore, the polarization-characteristic evaluating method includes a polarization setting step. Therefore, the method can handle the read-out operation from the FeRAM being in an insufficiently written state. In other words, the quantity of the polarization reversal can be evaluated by applying a pulse to the ferroelectric memory cell being in a medium polarization state.

What is claimed is:

1. An apparatus for evaluating the polarization characteristic of a ferroelectric capacitor, said apparatus comprising:
    a ferroelectric capacitor formed on a semiconductor substrate;
    a first pulse generator formed on the semiconductor substrate;
    a second pulse generator formed on the semiconductor substrate;
    a reference capacitor of a known capacitance value formed on the semiconductor substrate; and
    switch means formed on the semiconductor substrate, wherein
    a) a first electrode of said ferroelectric capacitor is connected to an output terminal of said first pulse generator,
    b) a second electrode of said ferroelectric capacitor is connected to an output terminal of said second pulse generator, and
    c) the second electrode of said ferroelectric capacitor is connected to a first electrode of said reference capacitor through said switch means.

2. The polarization characteristic evaluating apparatus according to claim 1, wherein one of the voltage pulses output from said first and second pulse generators is adjustable in its pulse width.

3. The polarization characteristic evaluating apparatus according to claim 1, further comprising an oscillator fabricated into said semiconductor substrate, said oscillator being connected at the first output terminal to the first electrode of said ferroelectric capacitor, and at the second output terminal to the second electrode of said ferroelectric capacitor.

4. The polarization characteristic evaluating apparatus according to claim 3, wherein the output terminal of said first pulse generator and the first output terminal of said oscillator are both connected to said ferroelectric capacitor through a buffer, and the output terminal of said second pulse generator and the second output terminal of said oscillator are both connected to said ferroelectric capacitor through another buffer.

5. The polarization characteristic evaluating apparatus according to claim 1, further comprising an oscillator being connected at the first output terminal to a trigger terminal of said first pulse generator, and at the second output terminal to a trigger terminal of said second pulse generator.

6. The polarization characteristic evaluating apparatus according to claim 5, wherein said oscillator is provided outside said semiconductor substrate.

7. The polarization characteristic evaluating apparatus according to claim 6, wherein said oscillator and said substrate are both assembled in one package.

8. The polarization characteristic evaluating apparatus according to claim 3, wherein the frequency of an output signal of said oscillator is variable.

9. The polarization characteristic evaluating apparatus according to claim 4, wherein the frequency of an output signal of said oscillator is variable.

10. The polarization characteristic evaluating apparatus according to claim 5, wherein the frequency of an output signal of said oscillator is variable.

11. The polarization characteristic evaluating apparatus according to claim 6, wherein the frequency of an output signal of said oscillator is variable.

12. The polarization characteristic evaluating apparatus according to claim 7, wherein the frequency of an output signal of said oscillator is variable.

13. A method of driving an apparatus for evaluating the polarization characteristic of a ferroelectric capacitor, said apparatus including a ferroelectric capacitor, a first pulse generator, a second pulse generator, and a reference capacitor of a known capacitance value, said capacitors and generators being all formed on a semiconductor substrate, said method comprising the steps of:
    applying a first voltage pulse to one of the first and second electrodes of said ferroelectric capacitor for the polarization reversal of said ferroelectric capacitor;
    connecting the second-electrode of said ferroelectric capacitor to the first electrode of said reference capacitor;
    measuring a potential variation at the first electrode of said reference capacitor when a second voltage pulse is applied to the first electrode of said ferroelectric capacitor in a state that a fixed voltage is applied to the second electrode of said reference capacitor; and
    calculating a variation of the amount of charge at the second electrode of said ferroelectric capacitor in said potential variation measuring step by using a potential variation measured in said potential variation measuring step, and the capacitance value of said reference capacitor.

14. A method of driving an apparatus for evaluating the polarization characteristic of a ferroelectric capacitor said method comprising the steps of:

reversing the polarization in said ferroelectric capacitor by applying a first voltage pulse to one of the first and second electrodes of said ferroelectric capacitor;

connecting the second electrode of said ferroelectric capacitor to the first electrode of said reference capacitor;

measuring a potential variation at the first electrode of said reference capacitor when a second voltage pulse is applied to the first electrode of said ferroelectric capacitor in a state that a fixed voltage is applied to the second electrode of said reference capacitor;

calculating a variation of the amount of charge at the second electrode of said ferroelectric capacitor in said potential variation measuring step by using a potential variation measured in said potential variation measuring step, and the capacitance value of said reference capacitor; and initializing the polarization of said ferroelectric capacitor by applying a third voltage pulse to one of the first and second electrodes of said ferroelectric capacitor before said polarization reversing step.

15. The polarization characteristic evaluating method according to claim 14, further comprising the step of setting up a polarization in said ferroelectric capacitor, said polarization set-up step being located between said polarization reversing step and said polarization initializing step.

16. The polarization characteristic evaluating method according to claim 14, further comprising the step of changing the pulse width of said first voltage pulse.

17. The polarization characteristic evaluating method according to claim 15, further comprising the step of changing the pulse width of said first voltage pulse.

18. The polarization characteristic evaluating method according to claim 14, further comprising the step of changing an amplitude of said first voltage pulse.

19. The polarization characteristic evaluating method according to claim 15, further comprising the step of changing an amplitude of said first voltage pulse.

20. The polarization characteristic evaluating method according to claim 16, further comprising the step of changing an amplitude of said first voltage pulse.

* * * * *